(12) United States Patent
Lee et al.

(10) Patent No.: US 12,484,328 B2
(45) Date of Patent: Nov. 25, 2025

(54) IMAGE SENSOR AND METHOD OF FABRICATING THE SAME

(71) Applicant: SAMSUNG ELECTRONICS CO., LTD., Suwon-si (KR)

(72) Inventors: Yun Ki Lee, Hwaseong-si (KR); Jonghoon Park, Seoul (KR); Bumsuk Kim, Hwaseong-si (KR); Junghyun Kim, Suwon-si (KR); Hyungeun Yoo, Suwon-si (KR); Yoongi Joung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 564 days.

(21) Appl. No.: 17/815,602

(22) Filed: Jul. 28, 2022

(65) Prior Publication Data

US 2023/0040494 A1 Feb. 9, 2023

(30) Foreign Application Priority Data

Aug. 6, 2021 (KR) .......................... 10-2021-0104097

(51) Int. Cl.
*H01L 21/56* (2006.01)
*H10F 39/00* (2025.01)

(52) U.S. Cl.
CPC ......... *H10F 39/807* (2025.01); *H10F 39/024* (2025.01); *H10F 39/8053* (2025.01); *H10F 39/8063* (2025.01)

(58) Field of Classification Search
CPC ........... H01L 27/1463; H01L 27/14621; H01L 27/14627; H01L 27/14685; H01L 27/14689; H01L 27/1462; H01L 27/14636; H01L 27/14692; H01L 27/14698

USPC ......................................................... 257/446
See application file for complete search history.

(56) References Cited

U.S. PATENT DOCUMENTS

| | | | |
|---|---|---|---|
| 9,305,947 B2* | 4/2016 | Ihara ................. | H01L 27/14687 |
| 9,484,376 B2* | 11/2016 | Wang .................. | H01L 27/1464 |
| 9,711,675 B2 | 7/2017 | Kim et al. | |
| 9,748,299 B2* | 8/2017 | Ahn ................. | H01L 27/14612 |
| 9,865,691 B2 | 1/2018 | Hu et al. | |
| 10,269,864 B2 | 4/2019 | Cheng et al. | |

(Continued)

FOREIGN PATENT DOCUMENTS

| | | |
|---|---|---|
| CN | 111627942 A | 9/2020 |
| KR | 10-0670606 | 1/2007 |

(Continued)

OTHER PUBLICATIONS

Office Action dated Jun. 23, 2025 issued in corresponding Korean Patent Application No. 10-2021-0104097.

*Primary Examiner* — Vu A Vu
(74) *Attorney, Agent, or Firm* — Morgan, Lewis & Bockius LLP

(57) ABSTRACT

A method of fabricating an image sensor includes forming a semiconductor substrate of a first conductivity type, forming a pixel isolation trench in in the semiconductor substrate to define pixel regions, forming a liner insulating layer in the pixel isolation trench, doping the liner insulating layer with dopants of a first conductivity type, forming a semiconductor layer on the liner insulating layer to fill the pixel isolation trench after the doping of the dopants, and performing a thermal treatment process on the semiconductor substrate.

20 Claims, 19 Drawing Sheets

(56) References Cited

U.S. PATENT DOCUMENTS

| | | | |
|---|---|---|---|
| 10,840,285 | B2 | 11/2020 | Kim et al. |
| 11,121,163 | B2 | 9/2021 | Kim |
| 11,239,269 | B2 | 2/2022 | Kim et al. |
| 11,721,774 | B2 * | 8/2023 | Yang .................. H01L 27/1463 257/431 |
| 11,948,956 | B2 * | 4/2024 | Hong ................ H01L 27/14689 |
| 2014/0145251 | A1 | 5/2014 | Favennec et al. |
| 2015/0243694 | A1 | 8/2015 | Ihara |
| 2016/0148969 | A1 | 5/2016 | Tsai et al. |
| 2020/0343294 | A1 | 10/2020 | Oh et al. |
| 2020/0381464 | A1 * | 12/2020 | Hong ................ H01L 27/14689 |
| 2021/0013249 | A1 | 1/2021 | Yang |
| 2021/0193704 | A1 | 6/2021 | Sun |
| 2023/0343883 | A1 * | 10/2023 | Yang ................ H01L 27/14643 |

FOREIGN PATENT DOCUMENTS

| | | |
|---|---|---|
| KR | 10-2015-0101681 A | 9/2015 |
| KR | 10-2020-0052126 A | 5/2020 |
| KR | 10-2114343 | 5/2020 |
| KR | 10-2020-0105197 A | 9/2020 |
| TW | 201730929 A | 9/2017 |

\* cited by examiner

IMAGE SENSOR AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2021-0104097, filed on Aug. 6, 2021, in the Korean Intellectual Property Office, the disclosure of which is incorporated by reference herein.

1. Technical Field

The present disclosure relates to an image sensor and a method of fabricating the same, and in particular, to an image sensor with improved electrical and optical characteristics and a method of fabricating the same.

2. Discussion of Related Art

An image sensor is a device that converts optical signals into electrical signals. With the development of computer and communications industries, there is an increasing demand for high-performance image sensors in a variety of applications such as digital cameras, camcorders, personal communication systems, gaming machines, security cameras, micro-cameras for medical applications, and robots.

The image sensors are generally classified into charge-coupled device (CCD) and complementary metal-oxide semiconductor (CMOS) image sensors. Since the CMOS image sensor is less complex than a CMOS image sensor, and circuits of the CMOS image sensor can be integrated on a single chip, a size of a corresponding product can be minimized. In addition, since a CMOS image sensor uses a small amount power, it can be applied to an electronic device with a limited battery capacity. Further, the manufacturing costs of CMOS image sensors are low and CMOS image sensors can capture images with a high resolution.

SUMMARY

At least one embodiment of the inventive concept provides an image sensor with improved electrical and optical characteristics.

At least one embodiment of the inventive concept provides a method of fabricating an image sensor with improved electrical and optical characteristics.

According to an embodiment of the inventive concept, a method of fabricating an image sensor includes forming a semiconductor substrate of a first conductivity type, forming a pixel isolation trench defining pixel regions in the semiconductor substrate, forming a liner insulating layer in the pixel isolation trench, doping the liner insulating layer with dopants of a first conductivity type, forming a semiconductor layer on the liner insulating layer to fill the pixel isolation trench after the doping of the dopants, and performing a thermal treatment process on the semiconductor substrate. The thermal treatment process may diffuse the dopants, which are contained in the liner insulating layer, into the semiconductor layer.

According to an embodiment of the inventive concept, a method of fabricating an image sensor includes forming a semiconductor substrate of a first conductivity type having a first surface and a second surface opposite to the first surface, forming a device isolation layer near the first surface of the semiconductor substrate, forming a pixel isolation structure to penetrate the device isolation layer and the semiconductor substrate and to define a plurality of pixel regions, forming photoelectric conversion regions of a second conductivity type in the semiconductor substrate and in the pixel regions, respectively, and forming a pixel gate electrode and a transfer gate electrode on the first surface of the semiconductor substrate, in each of the pixel regions. The forming of the pixel isolation structure may include patterning the device isolation layer and the semiconductor substrate to form a pixel isolation trench, depositing a liner insulating layer on a surface of the pixel isolation trench, doping the liner insulating layer with dopants of the first conductivity type, forming an undoped poly-silicon layer to fill the pixel isolation trench after the forming of the liner insulating layer doped with the dopants, etching the polysilicon layer to form a polysilicon pattern having a top surface located at a level lower than the first surface of the semiconductor substrate, and performing a thermal treatment process on the semiconductor substrate. The thermal treatment process may diffuse the dopants, which are contained in the liner insulating layer, into the polysilicon pattern.

According to an embodiment of the inventive concept, an image sensor includes a semiconductor substrate of a first conductivity type, and a pixel isolation structure provided in the semiconductor substrate to define a plurality of pixel regions. The pixel isolation structure includes a semiconductor pattern vertically penetrating the semiconductor substrate and a liner insulating pattern interposed between the semiconductor pattern and the semiconductor substrate. The semiconductor pattern and the liner insulating pattern include dopants of the first conductivity type, and a concentration of the dopants of the first conductivity type is higher in the liner insulating pattern than in the semiconductor pattern.

According to an embodiment of the inventive concept, an image sensor includes a semiconductor substrate, a pixel isolation structure, photoelectric conversion regions, a backside contact plug, a conductive pad, color filters and micro lenses. The semiconductor substrate is of a first conductivity type. The semiconductor substrate has a first surface and a second surface opposite the first surface. The semiconductor substrate includes a light-receiving region, a light-blocking region, and a pad region. The pixel isolation structure is located in the light-receiving region and the light-blocking region of the semiconductor substrate to define a plurality of pixel regions. The pixel isolation structure includes a semiconductor pattern vertically penetrating the semiconductor substrate and a liner insulating pattern interposed between the semiconductor pattern and the semiconductor substrate. The photoelectric conversion regions are located in the light-receiving region and the light-blocking region and in the semiconductor substrate of the pixel regions. The backside contact plug is located in a portion of the light-blocking region and adjacent to the second surface of the semiconductor substrate and is in contact with a portion of the semiconductor pattern. The conductive pad is located in the pad region and in the second surface of the semiconductor substrate. The color filters are located on the second surface of the semiconductor substrate to correspond to the pixel regions. The micro lenses are disposed on the color filters. The semiconductor pattern and the liner insulating pattern of the pixel isolation structure may include dopants of the first conductivity type. A concentration of the dopants of the first conductivity type may be higher in the liner insulating pattern than in the semiconductor pattern.

DETAILED DESCRIPTION

Example embodiments of the inventive concepts will now be described more fully with reference to the accompanying drawings, in which example embodiments are shown.

Figure 1:
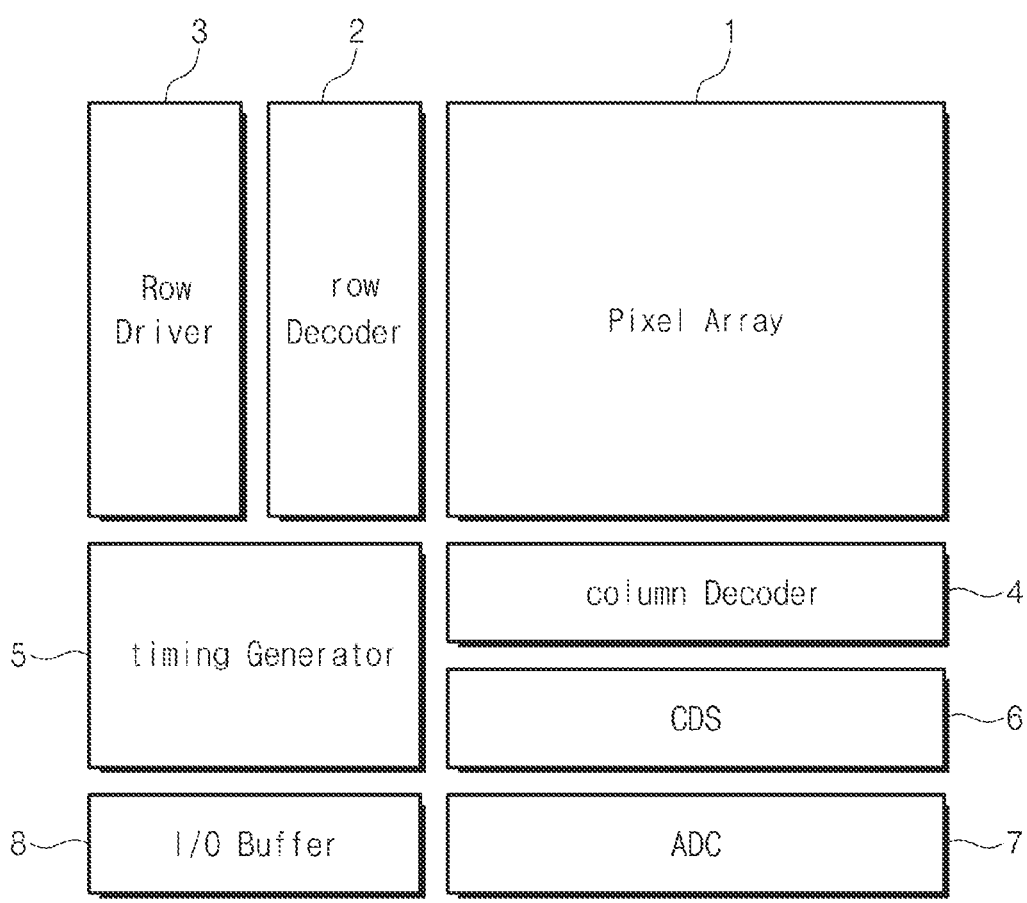
FIG. 1 is a block diagram illustrating an image sensor according to an embodiment of the inventive concept.

FIG. 1 is a block diagram illustrating an image sensor according to an embodiment of the inventive concept.

Referring to FIG. 1, an image sensor may include an active pixel sensor array 1, a row decoder 2 (e.g., a circuit), a row driver 3 (e.g., a circuit), a column decoder 4 (e.g., a circuit), a timing generator 5 (e.g., a timing controller or control circuit), a correlated double sampler (CDS) 6, an analog-to-digital converter (ADC) 7, and an input/output (I/O) buffer 8.

The active pixel sensor array 1 may include a plurality of unit pixels that are arranged two-dimensionally to convert optical signals to electrical signals. The active pixel sensor array 1 may be driven by a plurality of driving signals, such as a pixel selection signal, a reset signal, and a charge transmission signal, which are transmitted from the row driver 3. The converted electrical signal may be provided to the CDS 6.

The row driver 3 may be configured to provide the driving signals for driving the plurality of unit pixels to the active pixel sensor array 1, based on the result decoded by the row decoder 2. In the case where the unit pixels are arranged in a matrix shape (i.e., in rows and columns), the driving signals may be provided to respective rows.

The timing generator 5 may be configured to provide timing and control signals to the row decoder 2 and the column decoder 4.

The CDS 6 may be configured to receive the electric signals generated in the active pixel sensor array 1 and to perform a holding and sampling operation on the received electric signals. For example, the CDS 6 may perform a double sampling operation on a specific noise level and a signal level of the electric signal and may output a difference level corresponding to a difference between the noise and signal levels.

The ADC 7 may be configured to convert analog signals, which correspond to the difference level output from the CDS 6, into digital signals, and then to output the converted digital signals to the I/O buffer 8.

The I/O buffer 8 may be configured to latch the digital signal and to sequentially output the latched digital signals to an image signal processing unit (not shown), based on the result decoded by the column decoder 4.

Figure 2A:
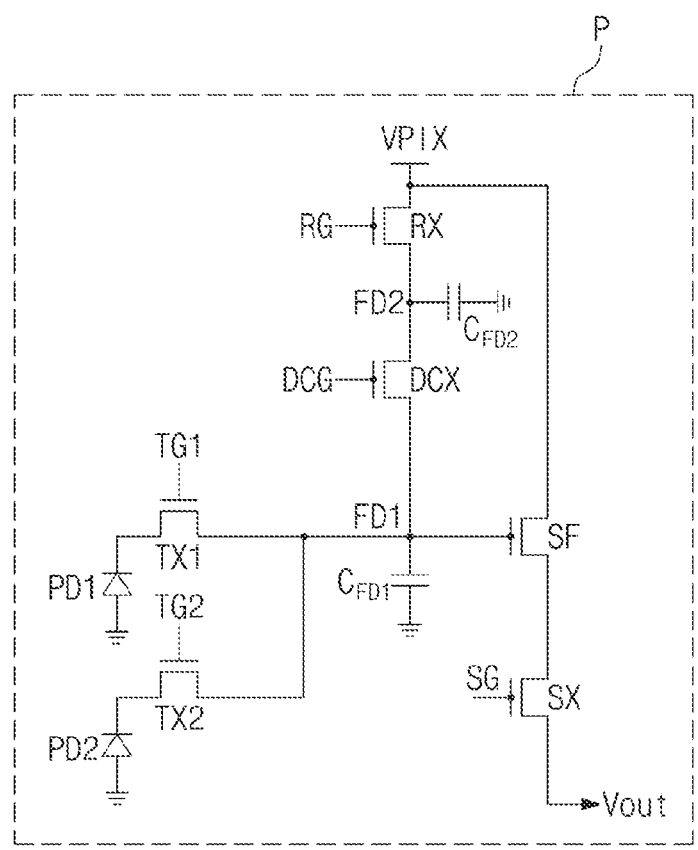
FIGS. 2A and 2B are circuit diagrams illustrating a unit pixel of an image sensor according to an embodiment of the inventive concept.
Figure 2B:
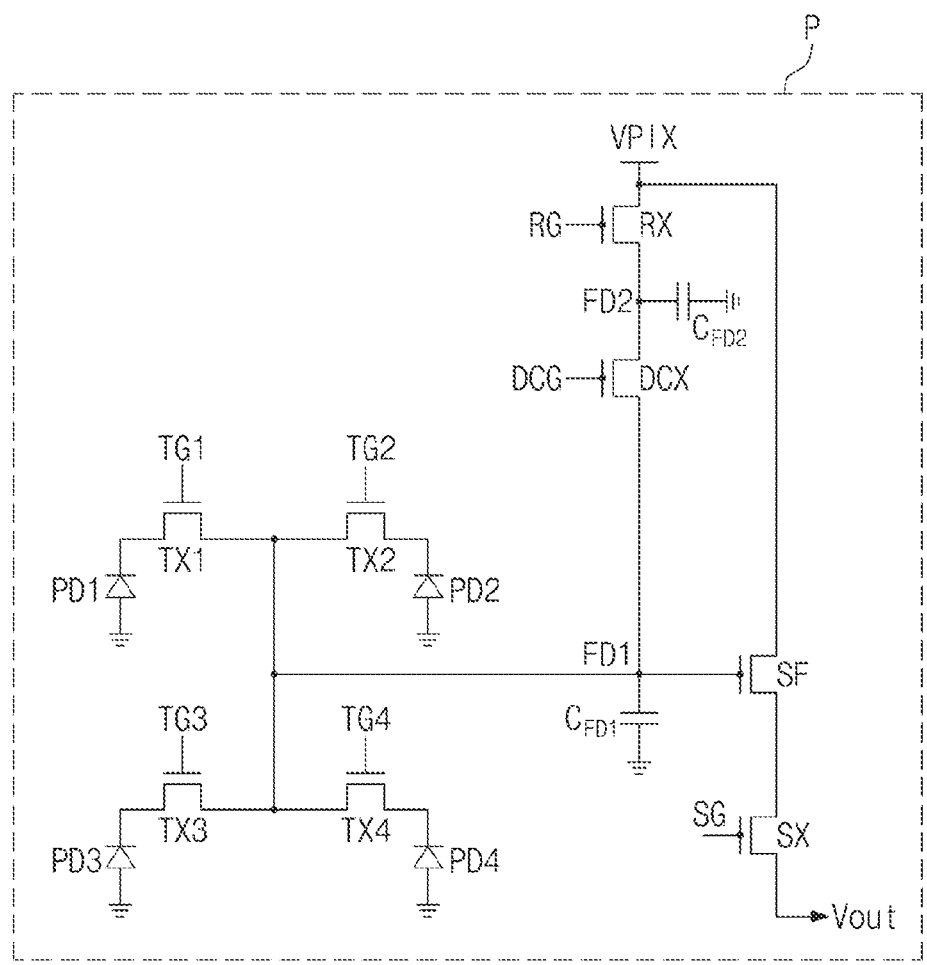

FIGS. 2A and 2B are circuit diagrams illustrating a unit pixel of an image sensor according to an embodiment of the inventive concept.

Referring to FIG. 2A, a unit pixel P may include first and second photoelectric conversion elements PD1 and PD2, first and second transfer transistors TX1 and TX2, and four pixel transistors.

The pixel transistors may include a reset transistor RX, a source follower transistor SF, a selection transistor SX, and a dual conversion gain transistor DCX. In an embodiment, each of the unit pixels P is illustrated to include four pixel transistors, but the inventive concept is not limited to this example. That is, the number of the pixel transistors in each of the unit pixels P may be variously changed.

In an embodiment, the first and second photoelectric conversion devices PD1 and PD2 may be configured to generate electric charges in response to an incident light. In this embodiment, the generated electric charges may be accumulated in the first and second photoelectric conversion devices PD1 and PD2. The first and second photoelectric conversion devices PD1 and PD2 may be, for example, a photodiode, a phototransistor, a photo gate, a pinned photodiode (PPD), and combinations thereof.

The first and second transfer transistors TX1 and TX2 may be configured to transfer the electric charges, which are stored in the first and second photoelectric conversion devices PD1 and PD2, to a first floating diffusion region FD1. The first and second transfer transistors TX1 and TX2 may be controlled by first and second transfer signals TG1 and TG2. The first and second transfer transistors TX1 and TX2 may share the first floating diffusion region FD1.

The first floating diffusion region FD1 may be configured to receive the electric charges, which are generated in the first or second photoelectric conversion device PD1 or PD2, and to cumulatively store the electric charges. The source follower transistor SF may be controlled by an amount of the photocharges stored in the first floating diffusion region FD1.

The reset transistor RX may reset electric charges, which are stored in the first floating diffusion region FD1 and a second floating diffusion region FD2, periodically in response to a reset signal applied to a reset gate electrode RG. In an embodiment, the reset transistor RX may include a drain terminal, which is connected to the dual conversion gain transistor DCX, and a source terminal, which is connected to a pixel power voltage $V_{PIX}$. If the reset transistor RX and the dual conversion gain transistor DCX are turned on, the pixel power voltage $V_{PIX}$ may be applied to the first and second floating diffusion regions FD1 and FD2. Accordingly, the electric charges, which are stored in the first and second floating diffusion regions FD1 and FD2, may be discharged, and as a result, the first and second floating diffusion regions FD1 and FD2 may be reset.

The dual conversion gain transistor DCX may be provided between the first floating diffusion region FD1 and the second floating diffusion region FD2 to connect them to each other. The dual conversion gain transistor DCX may be connected in series to the reset transistor RX through the second floating diffusion region FD2. In other words, the dual conversion gain transistor DCX may be provided between the first floating diffusion region FD1 and the reset transistor RX to connect them to each other. The dual conversion gain transistor DCX may be configured to change a first capacitance CFD1 of the first floating diffusion region FD1 in response to a dual conversion gain control signal DCG and thereby to change a conversion gain of the unit pixel P.

In detail, during an imaging process, not only a high intensity of light but also a low intensity of light may be incident onto the pixel array. Accordingly, a conversion gain in each pixel may vary depending on an incident light. For example, when the dual conversion gain transistor DCX is turned off, the unit pixel may have a first conversion gain, and when the dual conversion gain transistor DCX is turned on, the unit pixel may have a second conversion gain that is higher than the first conversion gain. That is, depending on an operation of the dual conversion gain transistor DCX, the conversion gain in a first conversion gain mode (or a high brightness mode) may have a value different from that in a second conversion gain mode (or a low brightness mode).

When the dual conversion gain transistor DCX is turned off, the first floating diffusion region FD1 may have a capacitance corresponding to the first capacitance CFD1. When the dual conversion gain transistor DCX is turned on, the first floating diffusion region FD1 may be connected to the second floating diffusion region FD2, and a capacitance of the first and second floating diffusion regions FD1 and FD2 may be a sum of first and second capacitance CFD1 and CFD2. That is, when the dual conversion gain transistor DCX is turned on, the capacitance of the first or second floating diffusion region FD1 or FD2 may be increased to reduce the conversion gain, and when the dual conversion gain transistor DCX is turned off, the capacitance of the first floating diffusion region FD1 may be decreased to increase the conversion gain.

The source follower transistor SF may be a source follower buffer amplifier, which is configured to generate a source-drain current in proportion to a charge amount of the first floating diffusion region FD1 to be input to a source follower gate electrode. The source follower transistor SF may amplify a variation in electric potential of the floating diffusion region FD to generate an amplified signal and may output the amplified signal to an output line Vout through the selection transistor SX. The source follower transistor SF may include a source terminal, which is connected to the pixel power voltage $V_{PIX}$, and a drain terminal, which is connected to a source terminal of the selection transistor SX.

The selection transistor SX may be used to select a row of the unit pixels P to be read out during a read operation. When the selection transistor SX is turned on by a selection signal SG applied to a selection gate electrode, an electrical signal, which is output to a drain electrode of the source follower transistor SF, may be output to the output line Vout.

Figure 4:
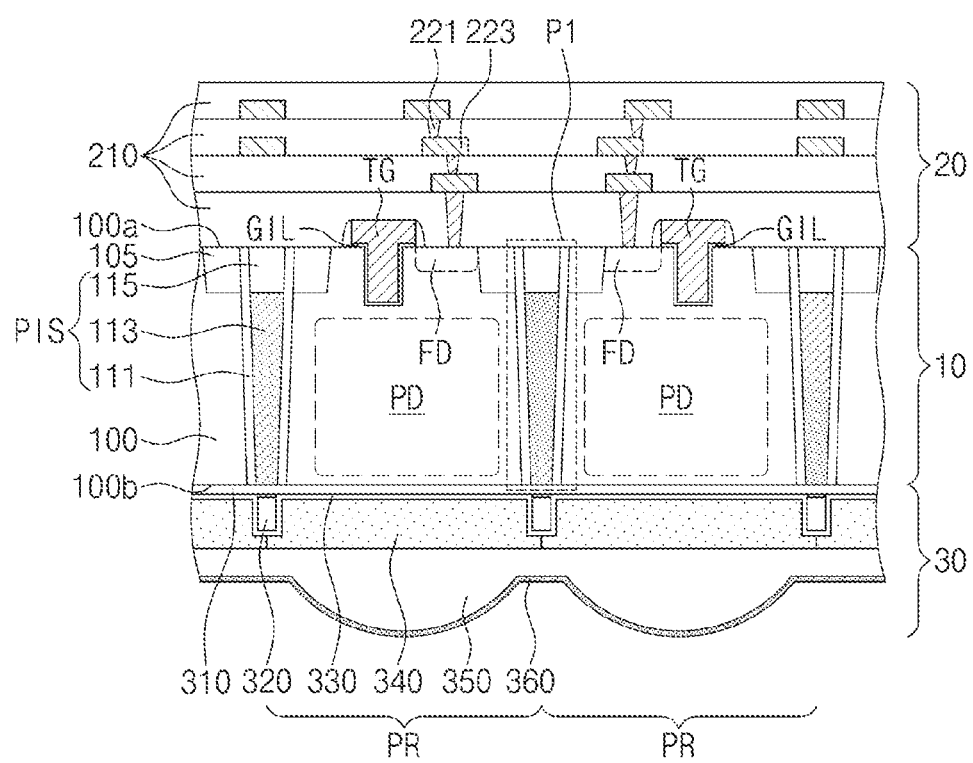
FIG. 4 is a sectional view taken along a line I-I' of FIG. 3 to illustrate an image sensor according to an embodiment of the inventive concept.

Referring to FIG. 2B and FIG. 4, the unit pixel P may include a photoelectric conversion circuit 10 and a pixel circuit 20, and the photoelectric conversion circuit 10 may include the first, second, third, and fourth photoelectric conversion devices PD1, PD2, PD3, and PD4, the first, second, third, and fourth transfer transistors TX1, TX2, TX3, and TX4, and the first floating diffusion region FD1, as described with reference to FIG. 2A. The pixel circuit 20 may include four pixel transistors (e.g., RX, DCX, SF, and SX), similar to the embodiment of FIG. 2A.

The first to fourth transfer transistors TX1, TX2, TX3, and TX4 may share the first floating diffusion region FD1. Transfer gate electrodes of the first to fourth transfer transistors TX1, TX2, TX3, and TX4 may be controlled by the first to fourth transfer signals TG1, TG2, TG3, and TG4, respectively.

Figure 3:
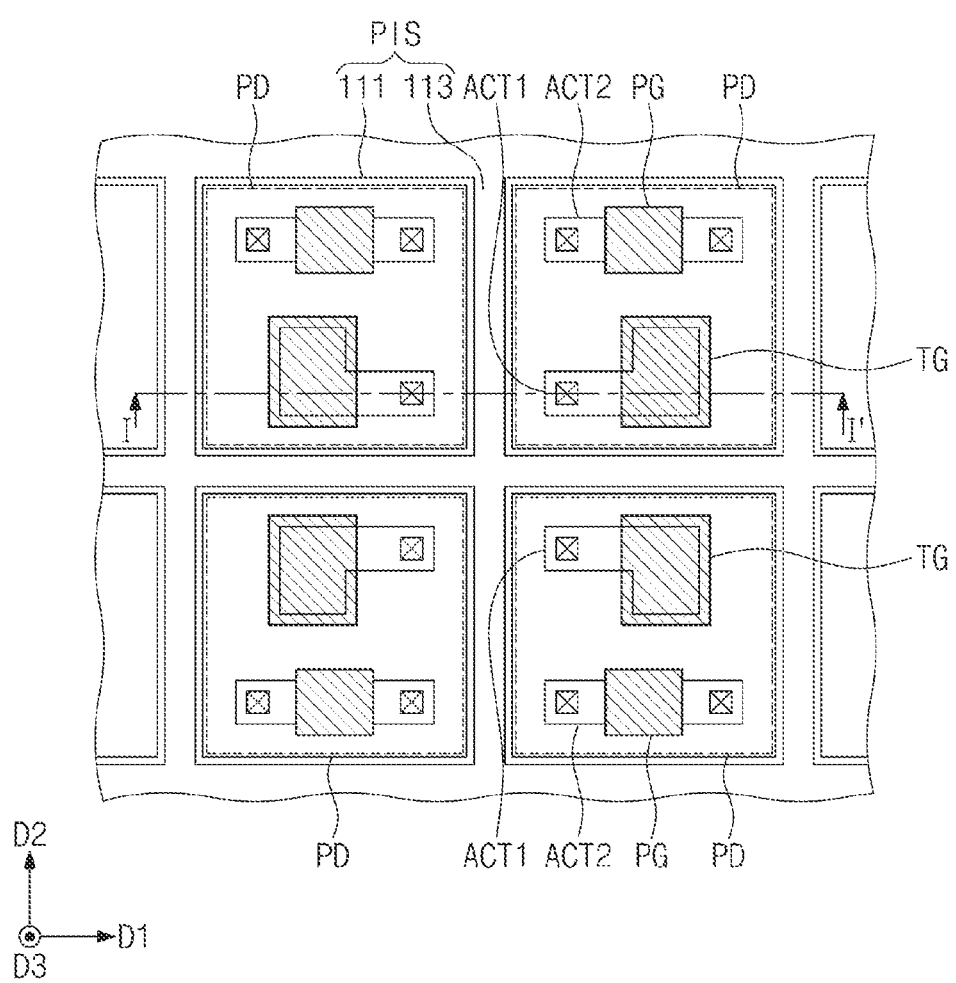
FIG. 3 is a plan view illustrating an image sensor according to an embodiment of the inventive concept.

FIG. 3 is a plan view illustrating an image sensor according to an embodiment of the inventive concept. FIG. 4 is a sectional view taken along a line I-I' of FIG. 3 to illustrate an image sensor according to an embodiment of the inventive concept.

Figure 5A:
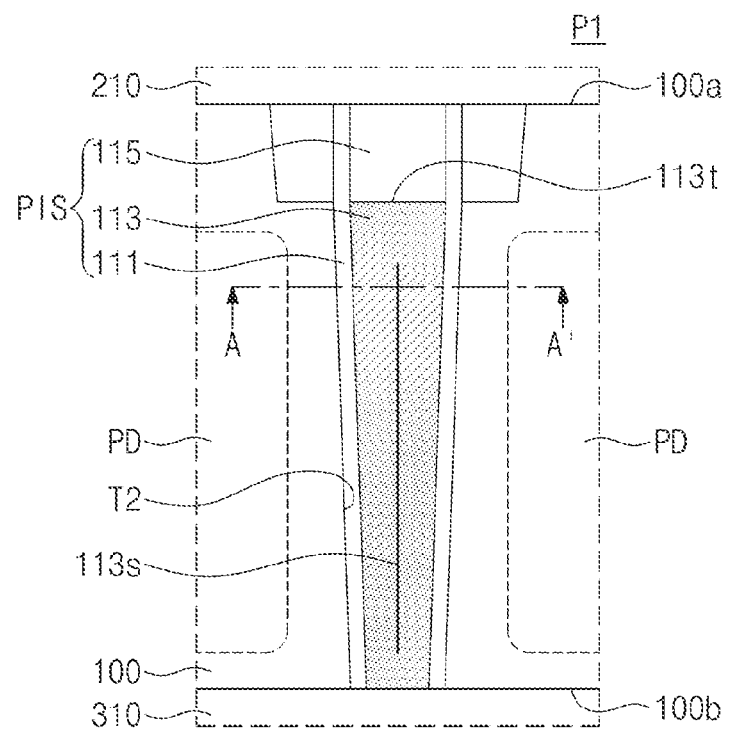
FIGS. 5A and 5B are enlarged sectional views illustrating a portion 'P1' of FIG. 4.
Figure 5B:
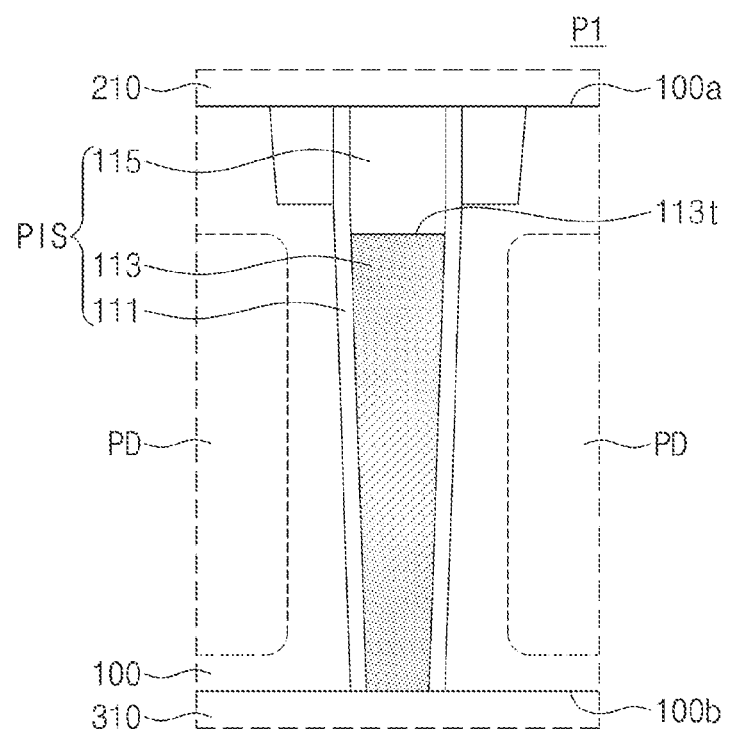
Figure 6A:
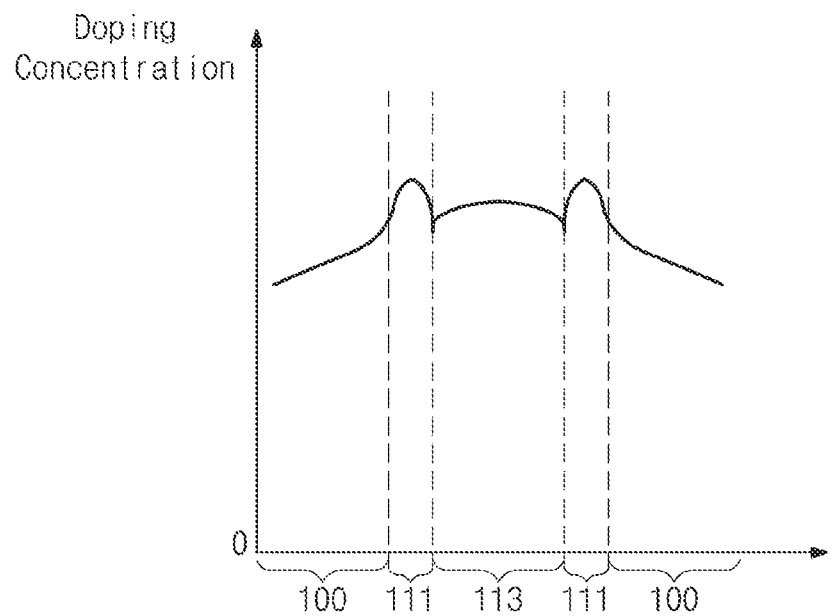
FIG. 6A is a graph showing a doping profile in a region taken along a line A-A' of FIG. 5A.
Figure 6B:
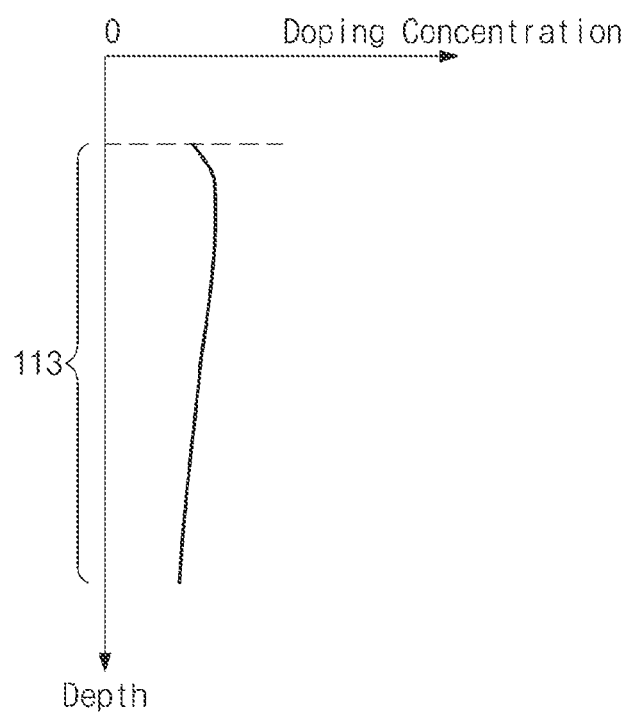
FIG. 6B is a graph showing a doping profile in a semiconductor pattern of an image sensor according to an embodiment of the inventive concept.

FIGS. 5A and 5B are enlarged sectional views illustrating a portion 'P1' of FIG. 4. FIG. 6A is a graph showing a doping profile in a region taken along a line A-A' of FIG. 5A. FIG. 6B is a graph showing a doping profile in a semiconductor pattern of an image sensor according to an embodiment of the inventive concept.

Referring to FIGS. 3 and 4, an image sensor according to an embodiment of the inventive concept may include a photoelectric conversion layer 10, a readout circuit layer 20, and an optically-transparent layer 30, when viewed in a vertical section.

The photoelectric conversion layer 10 may be disposed between the readout circuit layer 20 and the optically-transparent layer 30, when viewed in a vertical section. The photoelectric conversion layer 10 may be configured to convert light, which is incident from the outside, to electrical signals. The photoelectric conversion layer 10 may include a semiconductor substrate 100, a pixel isolation structure PIS, and photoelectric conversion regions PD.

In an embodiment, the semiconductor substrate 100 has a first or top surface 100a and a second or bottom surface 100b that is opposite to the first or top surface 100a. The semiconductor substrate 100 may be a substrate including a bulk silicon substrate and an epitaxial layer, which are sequentially stacked and are of a first conductivity type (e.g., p-type). In an embodiment where the bulk silicon substrate is removed during a fabrication process of an image sensor, the semiconductor substrate 100 may be composed of only a p-type epitaxial layer. In an embodiment, the semiconductor substrate 100 may be a bulk semiconductor substrate including a well of the first conductivity type.

In each of the pixel regions PR, a device isolation layer 105 may be disposed adjacent to the first surface 100a of the semiconductor substrate 100. The device isolation layer 105 may be provided in a device isolation trench T1, which is formed by recessing the first surface 100a of the semiconductor substrate 100. For example, a recess may be formed in the first surface 100a and the recess may be filled with the device isolation layer 105. The device isolation layer 105 may be formed of or include an insulating material. In an embodiment, the device isolation layer 105 may include a liner oxide layer and a liner nitride layer, which are formed to conformally cover a surface of the device isolation trench T1, and a gap-filling oxide layer, which is formed to fill the device isolation trench T1 provided with the liner oxide and nitride layers. The device isolation layer 105 may define an active portion in the semiconductor substrate 100 and be located near the first surface 100a. In an embodiment, the device isolation layer 105 may define first and second active portions ACT1 and ACT2 in the semiconductor substrate 100. In each of the pixel regions PR, the first and second active portions ACT1 and ACT2 may be spaced apart from each other and may have different sizes from each other. For example, in FIG. 3, the first active portion ACT1 has an L-shape and the second active portion ACT2 has a rectangular shape, but embodiments of the inventive concept are not limited thereto.

The pixel isolation structure PIS may be disposed in the semiconductor substrate 100 to define a plurality of the pixel regions PR. The pixel isolation structure PIS may vertically extend from the first surface 100a of the semiconductor substrate 100 to the second surface 100b. The pixel isolation structure PIS may penetrate a portion of the device isolation layer 105.

The pixel isolation structure PIS may include first portions, which extend in a first direction D1 and are parallel to each other, and second portions, which extend in a second direction D2 and are parallel to each other to cross the first portions. The pixel isolation structure PIS may be provided to enclose each of the pixel regions PR or each of the photoelectric conversion regions PD, when viewed in a plan view.

The pixel isolation structure PIS may have an upper width at a level of the first surface 100a of the semiconductor substrate 100 and may have a lower width at a level of the second surface 100b (e.g., a bottom surface) of the semiconductor substrate 100. The lower width may be substantially equal to or smaller than the upper width. In an embodiment, the width of the pixel isolation structure PIS may gradually decrease in a direction from the first surface 100a of the semiconductor substrate 100 toward the second surface 100b. The pixel isolation structure PIS may have a length in a direction (i.e., a third direction D3) perpendicular to the top surface 100a of the semiconductor substrate 100. The length of the pixel isolation structure PIS may be substantially equal to a vertical thickness of the semiconductor substrate 100.

In more detail, referring to FIGS. 5A and 5B, the pixel isolation structure PIS may be provided in a pixel isolation trench T2, which is formed in the semiconductor substrate 100. The pixel isolation structure PIS may include a liner insulating pattern 111, a semiconductor pattern 113, and a gapfill insulating pattern 115. The pixel isolation structure PIS may have an aspect ratio of about 10:1 to about 15:1.

The liner insulating pattern 111 may be provided between the semiconductor pattern 113 and the semiconductor substrate 100. The liner insulating pattern 111 may be in direct contact with the semiconductor substrate 100. In an embodiment, the liner insulating pattern 111 has a refractive index lower than the semiconductor substrate 100. For example, the liner insulating pattern 111 may be formed of or include at least one of silicon-based insulating materials (e.g., silicon nitride, silicon oxide, and/or silicon oxynitride) and/or high-k dielectric materials (e.g., hafnium oxide and/or aluminum oxide). In an embodiment, the liner insulating pattern 111 may include a plurality of layers which are formed of different materials. The liner insulating pattern 111 may have a thickness of about 30 Å to 350 Å.

The liner insulating pattern 111 may be provided to enclose each of the pixel regions PR, when viewed in a plan view. The liner insulating patterns 111 enclosing the pixel regions PR may be spaced apart from each other.

The semiconductor pattern 113 may be provided as a single body in the semiconductor substrate 100. That is, the semiconductor pattern 113 may be composed of a single layer. The semiconductor pattern 113, which is composed of the single layer, may have a discontinuous interface 113s (e.g., a seam or a void) which is formed in a center portion thereof. A top surface 113t of the semiconductor pattern 113 may be located at a level different from a top surface of the semiconductor substrate 100. Referring to FIG. 5A, the top surface 113t of the semiconductor pattern 113 may be located at substantially the same level as a bottom surface of the device isolation layer 105. Alternatively, referring to FIG. 5B, the top surface 113t of the semiconductor pattern 113 may be located at a level different from the bottom surface of the device isolation layer 105. For example, the top surface 113t of the semiconductor pattern 113 may be located lower than the bottom surface of the device isolation layer 105.

The semiconductor pattern 113 may include first portions, which extend in the first direction D1 to be parallel to each other, and second portions, which extend in the second direction D2 to be parallel to each other and to cross the first portions. The semiconductor pattern 113 may continuously extend in the first direction D1 and the second direction D2.

The liner insulating pattern 111 and the semiconductor pattern 113 may contain dopants of the first conductivity type. The dopants of the first conductivity type may include at least one of, for example, boron (B), phosphorus (P), arsenic (As), gallium (Ga), indium (In), antimony (Sb), or aluminum (Al).

As an example, the liner insulating pattern 111 and the semiconductor pattern 113 may contain boron, and a doping concentration of boron in the liner insulating pattern 111 may range from about $1 \times 10^{15}$ cm$^3$ to about $1 \times 10^{17}$ cm$^3$.

In an embodiment, as shown in FIG. 6A, a concentration of the first conductivity type dopants in the liner insulating pattern 111 may be higher than that in the semiconductor pattern 113. In an embodiment, the doping concentration of the first conductivity type dopants in the liner insulating pattern 111 may have the highest value. Alternatively, the first conductivity type dopants may have substantially the same concentration in the liner insulating pattern 111 and the semiconductor pattern 113.

In addition, a concentration of the dopants in the semiconductor pattern 113 may be about 1 to 10 times the concentration of the first conductivity type dopants in the semiconductor substrate 100. In an exemplary embodiment, a concentration of the dopants of the first conductivity type in the semiconductor pattern 113 is about 8 to 9 times a concentration of the dopants of the first conductivity type in the semiconductor substrate 100.

Referring to FIG. 6B, a concentration of the dopants in an upper region of the semiconductor pattern 113 adjacent to the first surface 100a of the semiconductor substrate 100 may be higher than or substantially equal to that in a lower region of the semiconductor pattern 113 adjacent to the second surface 100b of the semiconductor substrate 100.

The gapfill insulating pattern 115 may be disposed on the top surface 113t of the semiconductor pattern 113, and a top surface of the gapfill insulating pattern 115 may be located at substantially the same level as a top surface of the device isolation layer 105. A bottom surface of the gapfill insulating pattern 115 may be located at a level that is lower than or equal to a level of a bottom surface of the device isolation layer 105.

The bottom surface of the gapfill insulating pattern 115 may have a rounded shape. The gapfill insulating pattern 115 may be formed of or include at least one of silicon oxide, silicon oxynitride, or silicon nitride.

Referring back to FIGS. 3 and 4, the photoelectric conversion regions PD may be provided in the semiconductor substrate 100 in the pixel regions PR, respectively. The photoelectric conversion regions PD may generate photocharges in proportion to an intensity of an incident light. The photoelectric conversion regions PD may be formed by injecting impurities, which are of a second conductivity type different from the semiconductor substrate 100, into the semiconductor substrate 100. The photoelectric conversion region PD of the second conductivity type and the semiconductor substrate 100 of the first conductivity type may form a pn junction serving as a photodiode.

In an embodiment, each of the photoelectric conversion regions PD may be provided to have a difference in doping concentration between portions adjacent to the first and second surfaces 100a and 100b, thereby having a non-vanishing gradient in potential between the first and second surfaces 100a and 100b of the semiconductor substrate 100. For example, the photoelectric conversion regions PD may include a plurality of impurity regions which are vertically stacked.

The readout circuit layer 20 may be disposed on the first surface 100a of the semiconductor substrate 100. The readout circuit layer 20 may include readout circuits (e.g., MOS transistors), which are electrically connected to the photoelectric conversion regions PD. For example, the readout circuit layer 20 may include the reset transistor RX, the selection transistor SX, the dual conversion gain transistor DCX, and the selection transistor SX, described with reference to FIGS. 2A and 2B.

In each of the pixel regions PR, a transfer gate electrode TG may be disposed on the first active portion ACT1 of the semiconductor substrate 100. The transfer gate electrode TG may be located at a center portion of each pixel region PR, when viewed in a plan view. A portion of the transfer gate electrode TG may be disposed in the semiconductor substrate 100, and a gate insulating layer GIL may be interposed between the transfer gate electrode TG and the semiconductor substrate 100. For example, a first portion of the gate insulating layer GIL may contact a left exposed side of the transfer gate electrode TG and a second other portion of the gate insulating layer GIL may contact a right exposed side of the transfer gate electrode TG.

The floating diffusion region FD may be provided in a portion of the first active portion ACT1 located at a side of the transfer gate electrode TG. The floating diffusion region FD may be formed by injecting impurities into the semiconductor substrate 100. In an embodiment, a conductivity type of the floating diffusion region FD is different from that of the semiconductor substrate 100. For example, the floating diffusion region FD may be an n-type impurity region.

In each of the pixel regions PR, at least one pixel transistor may be provided on the second active portion ACT2. The pixel transistor, which is provided in each pixel region PR, may be one of the reset transistor RX, the source follower transistor SF, the dual conversion gain transistor DCX, and the selection transistor SX described with reference to FIGS. 2A and 2B.

The pixel transistor may include a pixel gate electrode PG, which is provided to cross the second active portion ACT2, and source/drain regions, which are provided in portions of the second active portion ACT2 located at both sides of the pixel gate electrode PG.

The pixel gate electrode PG may have a bottom surface that is parallel to a top surface of the second active portion ACT2. The pixel gate electrode PG may be formed of or include at least one of, for example, doped polysilicon, metallic materials, conductive metal nitrides, conductive metal silicide materials, conductive metal oxide materials, or combinations thereof.

The gate insulating layer GIL may be disposed between the pixel gate electrode PG and the second active portion ACT2. The gate insulating layer GIL may be formed of or include at least one of silicon oxide, silicon oxynitride, high-k dielectric materials whose dielectric constants are higher than that of the silicon oxide, or combinations thereof. The source/drain regions of the pixel transistor may contain impurities of the second conductivity type. As an example, the source/drain regions may contain n-type impurities.

Interlayer insulating layers 210 may be provided on the first surface 100a of the semiconductor substrate 100 to cover the transfer gate electrode TG and the pixel gate electrodes PG.

An interconnection structure 221 and 223, which is connected to the readout circuits, may be disposed in the interlayer insulating layers 210. The interconnection structure 221 and 223 may include metal lines 223 and contact plugs 221 connecting the metal lines 223 to each other.

The optically-transparent layer 30 may be disposed on the second surface 100b of the semiconductor substrate 100. The optically-transparent layer 30 may include a planarization insulating layer 310, a lattice structure 320, a protection layer 330, color filters 340, micro lenses 350, and a passivation layer 360. The optically-transparent layer 30 may be configured to perform an operation of focusing and filtering light, which is incident from the outside, and to provide the light to the photoelectric conversion layer 10.

In detail, the planarization insulating layer 310 may cover the second surface 100b of the semiconductor substrate 100. The planarization insulating layer 310 may be formed of a transparent insulating material and may include a plurality of layers. In an embodiment, the planarization insulating layer 310 is formed of an insulating material whose refractive index is different from the semiconductor substrate 100. The planarization insulating layer 310 may be formed of or include at least one of metal oxide and/or silicon oxide.

The lattice structure 320 may be disposed on the planarization insulating layer 310. When viewed in a plan view, the lattice structure 320 may have a lattice shape, similar to the pixel isolation structure PIS. The lattice structure 320 may be overlapped with the pixel isolation structure PIS, when viewed in a plan view. That is, the lattice structure 320 may include first portions, which extend in the first direction D1, and second portions, which extend in the second direction D2 to cross the first portions. A width of the lattice structure 320 may be substantially equal to or smaller than the smallest width of the pixel isolation structure PIS.

The lattice structure 320 may include a conductive pattern and/or a low refractive pattern. A light-blocking pattern may be formed of or include at least one of metallic materials (e.g., titanium, tantalum, or tungsten). In an embodiment, the low refractive pattern is formed of or includes a material whose refractive index is lower than the light-blocking pattern. The low refractive pattern may be formed of an organic material. In an embodiment, the low refractive pattern has a refractive index of about 1.1 to 1.3. For example, the lattice structure 320 may be a polymer layer including silica nano-particles.

The protection layer 330 may be provided on the planarization insulating layer 310 to cover a surface of the lattice structure 320 conformally (i.e., to a substantially uniform thickness). The protection layer 330 may be a single- or multi-layered structure including at least one of an aluminum oxide layer and a silicon carbon oxide layer.

The color filters 340 may be formed to correspond to the pixel regions PR, respectively. The color filters 340 may be provided to fill empty regions defined by the lattice structure 320. The color filters 340 may include red, green, or blue color filters or magenta, cyan, or yellow color filters whose colors are determined based on positions of the unit pixels.

The micro lenses 350 may be disposed on the color filters 340. The micro lenses 350 may have a convex shape and may have a specific curvature radius. The micro lenses 350 may be formed of or include an optically transparent resin.

The passivation layer 360 may be formed to conformally cover the surfaces of the micro lenses 350. The passivation layer 360 may be formed of or include at least one of, for example, inorganic oxide materials.

Figure 7:
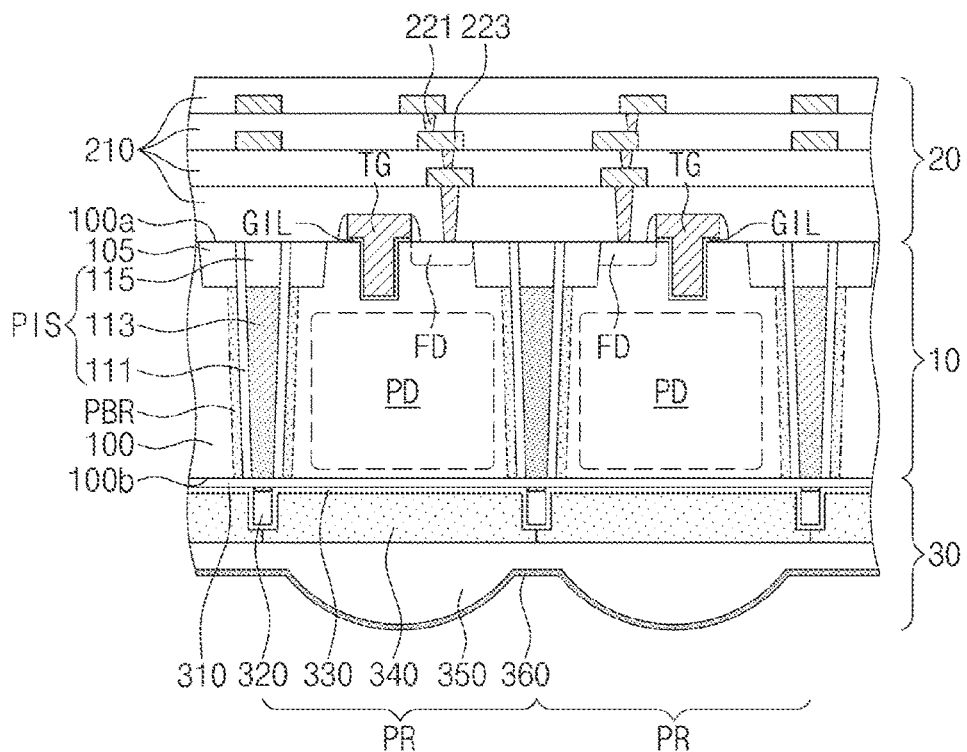
FIGS. 7, 8, and 9 are sectional views, each of which is taken along the line I-I' of FIG. 3 to illustrate an image sensor according to an embodiment of the inventive concept.
Figure 8:
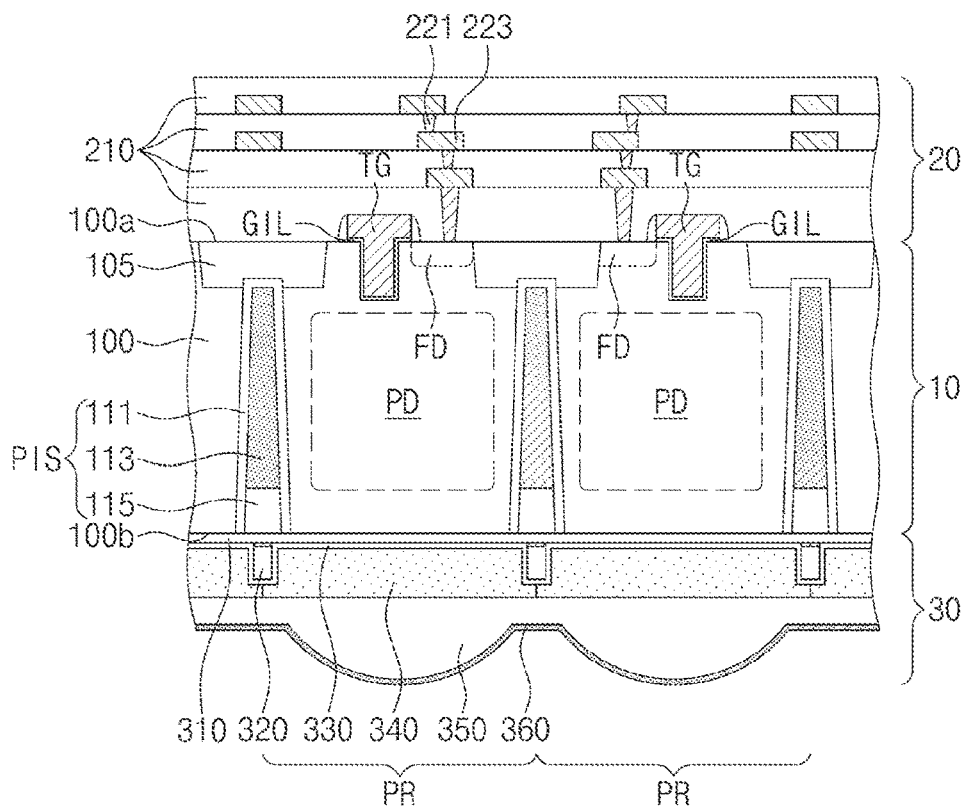
Figure 9:
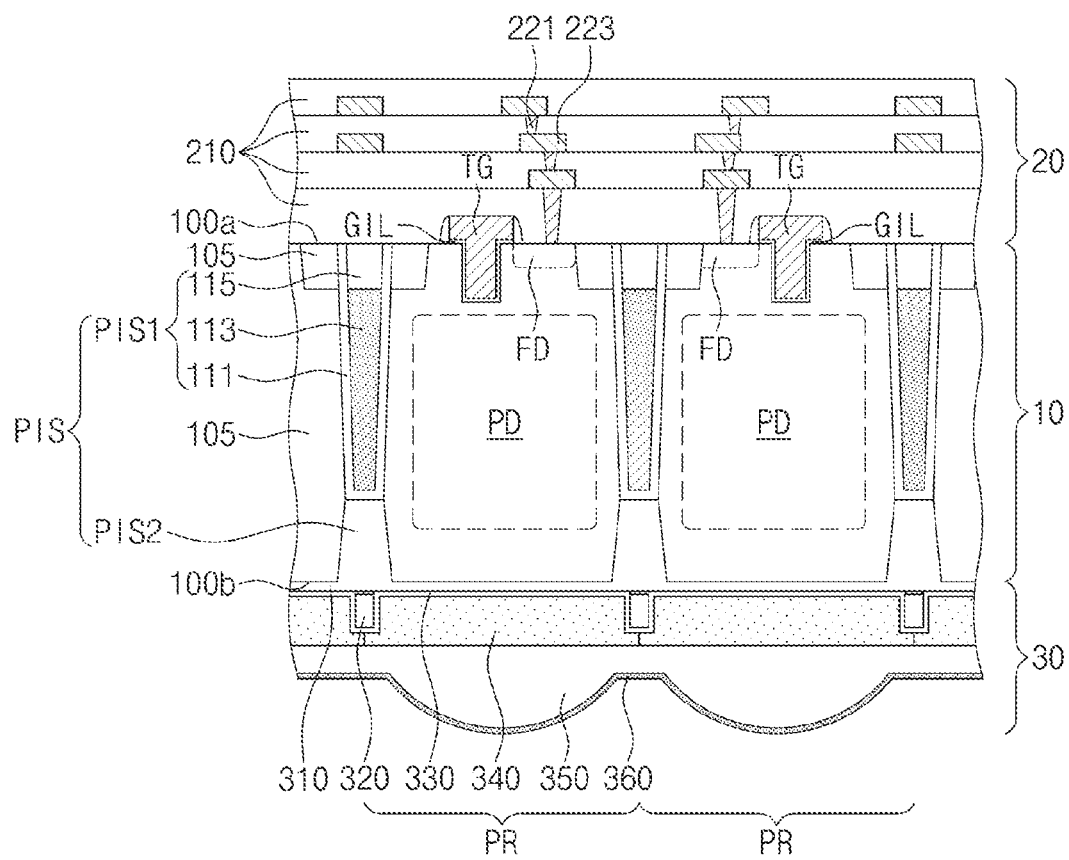

FIGS. 7, 8, and 9 are sectional views, each of which is taken along the line I-I' of FIG. 3 to illustrate an image sensor according to an embodiment of the inventive concept.

In the embodiment of FIGS. 7, 8, and 9, an element previously described with reference to FIGS. 3 and 4 may be identified by the same reference number without repeating an overlapping description thereof, for concise description.

Referring to FIG. 7, a potential barrier region PBR, which contains impurities of the second conductivity type, may be provided in a portion of the semiconductor substrate 100 that is adjacent to a side surface of the pixel isolation structure PIS. The potential barrier region PBR may contain impurities that are of the same conductivity type (e.g., the first conductivity type or the p-type) as the semiconductor substrate 100. The potential barrier region PBR may be in contact with a side surface of the liner insulating pattern 111 of the pixel isolation structure PIS. The potential barrier region PBR may contain impurities, which are of the same kind as the impurities in the liner insulating pattern 111. In an embodiment, an impurity concentration of the potential barrier region PBR is higher than an impurity concentration of the semiconductor substrate 100. Electron-hole pairs (EHP) causing a dark current may be generated by a surface defect of the pixel isolation trench T2 created during a process of forming the pixel isolation trench T2. However, the dark current may be reduced by the potential barrier region PBR according to an embodiment of the inventive concept.

Referring to FIG. 8, the pixel isolation structure PIS may have a first width near the first surface 100a of the semiconductor substrate 100 and a second width, which is greater than the first width, near the second surface 100b of the semiconductor substrate 100. In addition, the width of the pixel isolation structure PIS may gradually increase in a direction from the first surface 100a of the semiconductor substrate 100 toward the second surface 100b.

The pixel isolation structure PIS may include the liner insulating pattern 111, the semiconductor pattern 113, and the gapfill insulating pattern 115, as described above.

The pixel isolation structure PIS may be in contact with the device isolation layer 105. In an embodiment, a portion of the liner insulating pattern 111 of the pixel isolation structure PIS may be in contact with the device isolation layer 105. The portion of the liner insulating pattern 111 may be located between the device isolation layer 105 and the semiconductor pattern 113.

Referring to FIG. 9, the pixel isolation structure PIS may include first and second pixel isolation structures PIS1 and PIS2. Here, the first pixel isolation structure PIS may be configured to have substantially the same features as the pixel isolation structure PIS previously described with reference to FIGS. 3 and 4. A portion of the liner insulating pattern 111 may be in contact with the second pixel isolation structure PIS2 and may be disposed between the second pixel isolation structure PIS2 and the semiconductor pattern 113.

The second pixel isolation structure PIS2 may have substantially the same planar structure as the first pixel isolation structure PIS1. When viewed in a plan view, the second pixel isolation structure PIS2 may overlap with the first pixel isolation structure PIS1. That is, the second pixel isolation structure PIS2 may include first portions, which extend in the first direction D1, and second portions, which extend in the second direction D2 to cross the first portions.

The second pixel isolation structure PIS2 may extend from the second surface 100b of the semiconductor substrate 100 in a vertical direction D3 and may be provided in the semiconductor substrate 100. The second pixel isolation structure PIS2 may be provided in a trench which is recessed from the second surface 100b of the semiconductor substrate 100. For example, a recess may be formed in the second surface 100b and the recess may be filled with the second pixel isolation structure PIS2.

The second pixel isolation structure PIS2 may have a bottom surface which is located between the first and second surfaces 100a and 100b of the semiconductor substrate 100. That is, the second pixel isolation structure PIS2 may be spaced apart from the first surface 100a of the semiconductor substrate 100. The second pixel isolation structure PIS2 may be in contact with the first pixel isolation structure PIS1. For example, the bottom surface of the second pixel isolation structure PIS2 may contact a bottom surface of the first pixel isolation structure PIS1.

The second pixel isolation structure PIS2 may have a second upper width at a level of the second surface 100b of the semiconductor substrate 100 and may have a second lower width at a level of its bottom surface. The second lower width may be smaller than or substantially equal to the second upper width. The width of the second pixel isolation structure PIS2 may gradually decrease from the second surface 100b of the semiconductor substrate 100 toward the first surface 100a.

When measured in the vertical direction D3, a length of the second pixel isolation structure PIS2 may be different from a length of the first pixel isolation structure PIS1. In an embodiment, the length of the second pixel isolation structure PIS2 may be smaller than or equal to the length of the first pixel isolation structure PIS1.

The second pixel isolation structure PIS2 may be formed of or include at least one of high-k dielectric materials whose dielectric constants are higher than that of the silicon oxide layer. As an example, the second pixel isolation structure PIS2 may include a metal oxide or metal fluoride containing at least one metallic element selected from the group consisting of hafnium (Hf), zirconium (Zr), aluminum (Al), tantalum (Ta), titanium (Ti), yttrium (Y), and lanthanum (La). For example, the second pixel isolation structure PIS2 may include an aluminum oxide layer and a hafnium oxide layer, which are sequentially stacked.

Figure 10:
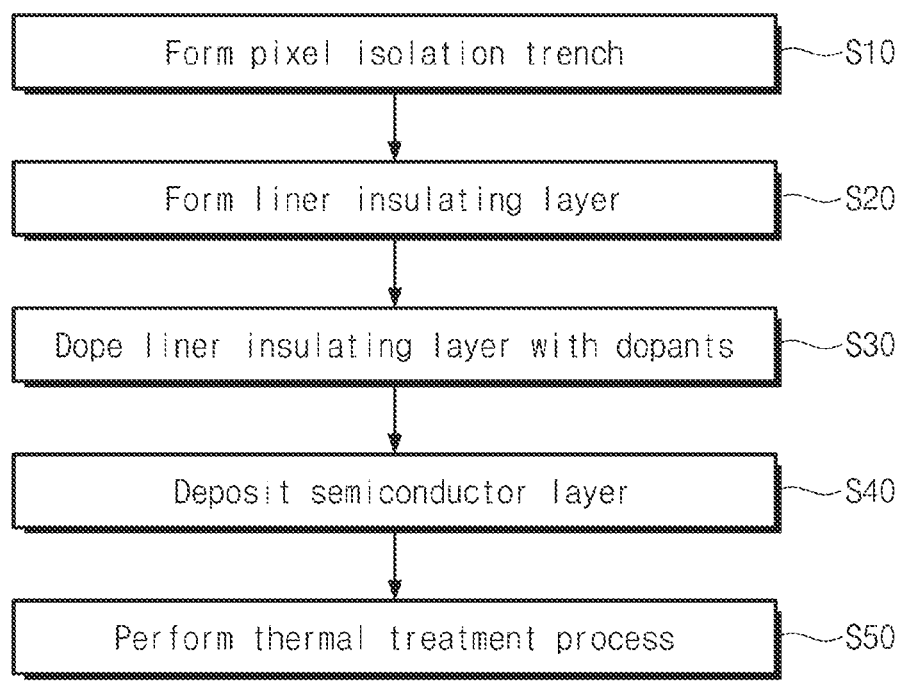
FIG. 10 is a flow chart illustrating a method of forming a pixel isolation structure of an image sensor, according to an embodiment of the inventive concept.

FIG. 10 is a flow chart illustrating a method of forming a pixel isolation structure of an image sensor, according to an embodiment of the inventive concept. FIGS. 11 to 21 are sectional views, which are taken along the line I-I' of FIG. 3 to illustrate a method of fabricating an image sensor according to an embodiment of the inventive concept.

Figure 11:
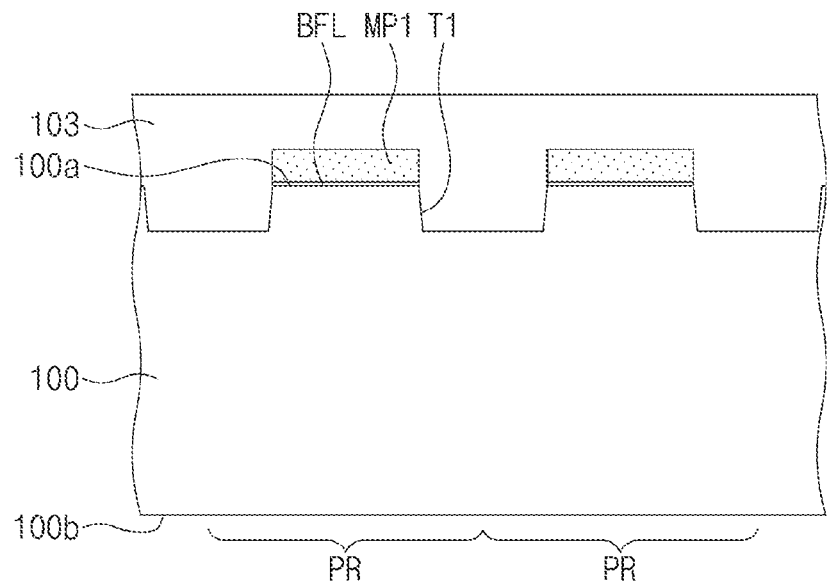
FIGS. 11 to 21 are sectional views, which are taken along the line I-I' of FIG. 3 to illustrate a method of fabricating an image sensor according to an embodiment of the inventive concept.

Referring to FIGS. 5 and 11, the semiconductor substrate 100 of the first conductivity type (e.g., p-type) may be formed or provided. The semiconductor substrate 100 may have the first surface 100a and the second surface 100b opposite to the first surface 100a. The semiconductor substrate 100 may include a bulk silicon substrate of a first conductivity type and an epitaxial layer, which is formed on the bulk silicon substrate and is of the first conductivity type. Here, the epitaxial layer may be formed by a selective epitaxial growth (SEG) process using the bulk silicon substrate as a seed, and the epitaxial layer may be doped with impurities of the first conductivity type, during the epitaxial growth process. For example, the epitaxial layer may contain p-type impurities.

In an embodiment, the semiconductor substrate 100 may be a bulk semiconductor substrate including a well of the first conductivity type. In an embodiment, the semiconductor substrate 100 may be a silicon-on-insulator (SOI) substrate, a germanium substrate, a germanium-on-insulator (GOI) substrate, or a silicon-germanium substrate.

The device isolation trench T1 may be formed by patterning the first surface 100a of the semiconductor substrate 100. The device isolation trench T1 may define the first and second active portions ACT1 and ACT2 in each of the pixel regions PR. The formation of the device isolation trench T1 may include forming a buffer layer BFL and a mask pattern MP on the first surface 100a of the semiconductor substrate 100 and anisotropically etching the semiconductor substrate 100 using the mask pattern MP as an etch mask.

The buffer layer BFL may be formed by performing a deposition process or a thermal oxidation process on the first surface 100a of the semiconductor substrate 100. The buffer layer BFL may include a silicon oxide layer.

The mask pattern MP may include a silicon nitride layer or a silicon oxynitride layer.

Next, a device isolation insulating layer 103 may be formed to fill the device isolation trench T1. The device isolation insulating layer 103 may be formed by thickly depositing an insulating material on the semiconductor substrate 100 provided with the device isolation trench T1. The device isolation insulating layer 103 may fill the device isolation trench T1 and may cover the mask pattern MP.

Figure 12:
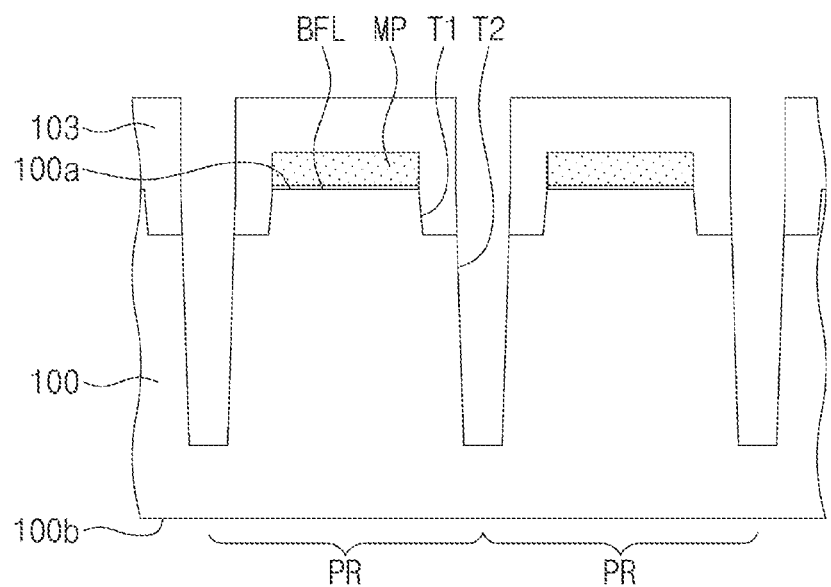

Thereafter, referring to FIGS. 5, 10, and 12, the pixel isolation trench T2 is formed in the semiconductor substrate 100 to define pixel regions (in S10). For example, the pixels regions are formed in the semiconductor substrate 100.

The pixel isolation trench T2 may be formed by patterning the device isolation insulating layer 103 and the first surface 100a of the semiconductor substrate 100. A plurality of first and second pixel regions may be arranged in a matrix shape or in the first and second directions D1 and D2 crossing each other.

In detail, the formation of the pixel isolation trench T2 may include forming a second mask pattern (not shown) on the device isolation insulating layer 103 and anisotropically etching the semiconductor substrate 100 using the second mask pattern as an etch mask.

The pixel isolation trench T2 may vertically extend from the first surface 100a of the semiconductor substrate 100 toward the second surface 100b to expose a portion of a side surface of the semiconductor substrate 100. The pixel isolation trench T2 may be formed to be deeper than the device isolation trench T1 and may penetrate a portion of the device isolation trench T1. The pixel isolation trench T2 may be a deep trench which has an aspect ratio of about 10:1 to 15:1.

When viewed in a plan view, the pixel isolation trench T2 may include a plurality of first regions, which extend in the first direction D1 and has a uniform width, and a plurality of second regions, which extend in the second direction D2 crossing the first direction D1 and has a uniform width.

Since the pixel isolation trench T2 is formed by performing the anisotropic etching process, the pixel isolation trench T2 may have a gradually decreasing width in a direction from the first surface 100a of the semiconductor substrate 100 toward the second surface 100b. That is, the pixel isolation trench T2 may have one or more inclined side surfaces. A bottom surface of the pixel isolation trench T2 may be spaced apart from the second surface 100b of the semiconductor substrate 100.

The second mask pattern may be removed, after the formation of the pixel isolation trench T2.

Figure 13:
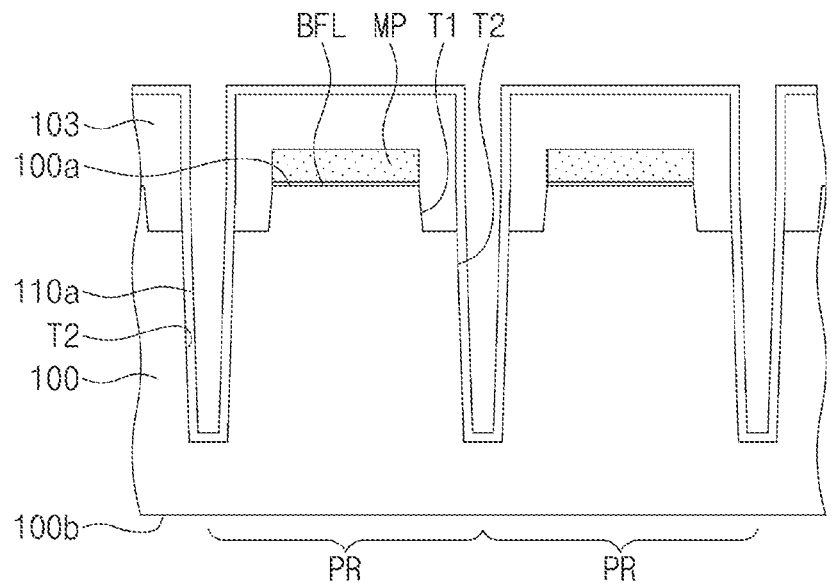

Referring to FIGS. 5, 10, and 13, a preliminary liner insulating layer 110a is formed in the pixel isolation trench T2 (in S20). For example, the preliminary liner insulating layer 110a may be formed to cover an inner surface of the pixel isolation trench T2.

The preliminary liner insulating layer 110a may conformally cover the inner surface of the pixel isolation trench T2 and a top surface of the device isolation insulating layer 103. The preliminary liner insulating layer 110a may be deposited by a deposition method having a good step-coverage property. The preliminary liner insulating layer 110a may be formed of or include at least one of, for example, silicon oxide, silicon nitride, and/or silicon oxynitride. In an embodiment, the preliminary liner insulating layer 110a may be deposited to have a thickness of about 30 Å to 350 Å.

Figure 14:
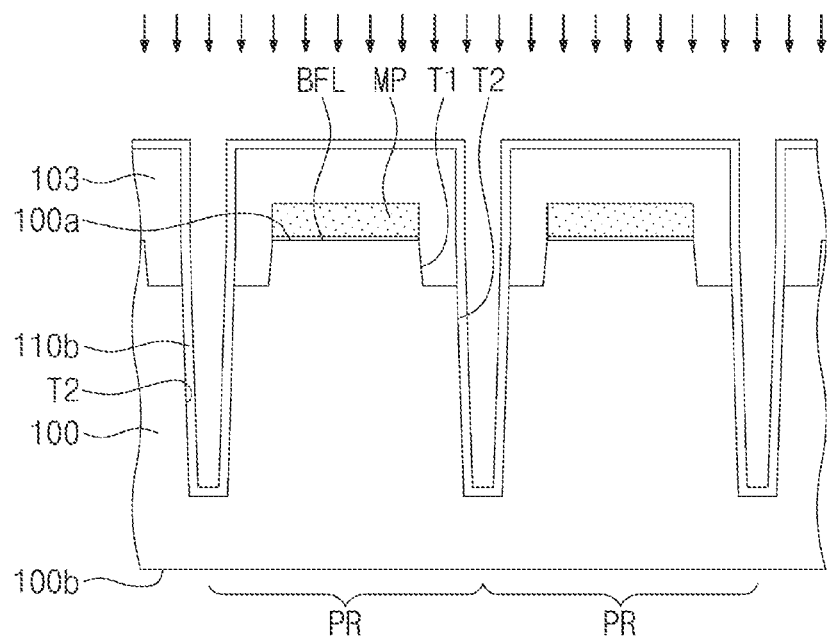

Referring to FIGS. 5, 10, and 14, a doping process is performed on the preliminary liner insulating layer 110a (in S30).

The doping process may include doping the preliminary liner insulating layer 110a with dopants of the first conductivity type. A liner insulating layer 110b of the first conductivity type may be formed, as a result of the doping of the preliminary liner insulating layer 110a.

The doping process may be, for example, a beam line ion implantation process or a plasma doping process (PLAD). In the case of the plasma doping process, a source material in a gaseous state may be supplied into a process chamber. The source material may be ionized by plasma, and then, the ionized source materials may be injected into the preliminary liner insulating layer 110a by applying a bias of high voltage to an electrostatic chuck (not shown), on which the semiconductor substrate 100 is placed.

In the case of the plasma doping process, it may be possible to realize a uniform doping profile even at a deep level and to reduce a process time for the doping process. In this case, it may be possible to realize a uniform doping concentration, regardless of position in the preliminary liner insulating layer 110a. More specifically, the preliminary liner insulating layer 110a may include a first region adjacent to the first surface 100a of the semiconductor substrate 100 and a second region adjacent to the second surface 100b of the semiconductor substrate 100. A concentration of the first conductivity type dopants in the first region of the preliminary liner insulating layer 110a may be substantially equal to a doping concentration of the second region the preliminary liner insulating layer 110a.

For the beam line ion implantation process, it may be difficult to uniformly dope the liner insulating layer 110b regardless of a vertical depth, because the device isolation trench T1 is formed to have a large depth and a small width. In other words, in the case where the doping process is performed by the beam line ion implantation process, a doping concentration in the liner insulating layer 110b may vary depending on a vertical depth. For example, a doping concentration of an upper portion of the liner insulating layer 110b may be higher than a doping concentration of a lower portion of the liner insulating layer 110b.

In an embodiment, a gas phase doping process may be performed as the doping process. The gas phase doping process may include supplying a doping gas onto an inner surface of the preliminary liner insulating layer 110a. Here, the doping gas may contain an element (e.g., aluminum (Al), boron (B), indium (In), and/or gallium (Ga)) in group III. As an example, the doping gas may contain a boron-containing gas (e.g., boron trichloride $BCl_3$ or boron hydride $B_2H_6$). As another example, the doping gas may contain boron trifluoride $BF_3$. After the doping process, a doping concentration of boron in the liner insulating layer 110b may range from about $1 \times 10^{15}$ $cm^3$ to about $1 \times 10^{17}$ $cm^3$.

Figure 15:
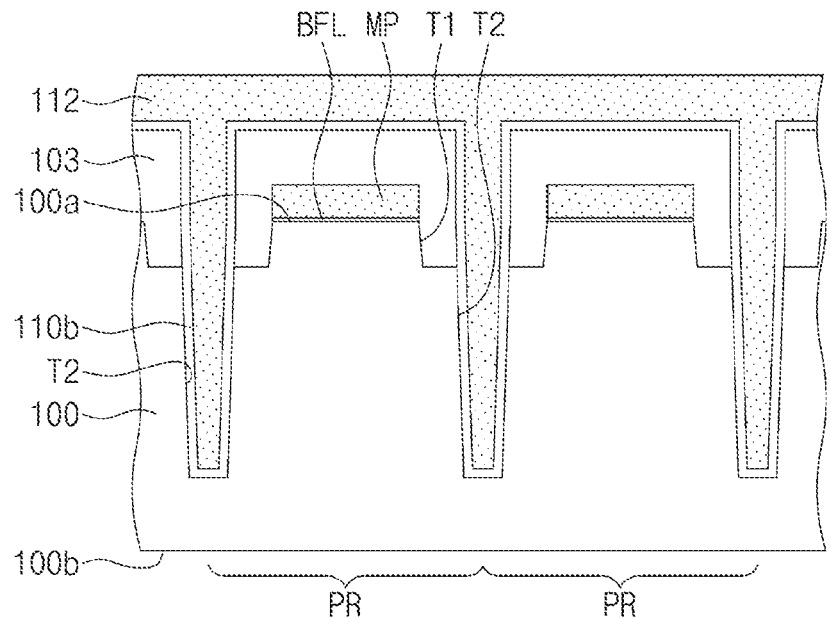

Referring to FIGS. 5, 10, and 15, a semiconductor layer 112 is formed on the liner insulating layer 110b to fill the pixel isolation trench T2 (in S40). The forming of the semiconductor layer 112 may be performed after the doping of the liner insulating layer 110b. In an embodiment, the semiconductor layer 112 may be an undoped poly-silicon layer.

The semiconductor layer 112 may be formed by a film-forming process (e.g., a chemical vapor deposition (CVD) process or an atomic layer deposition (ALD) process) having a good step coverage property. In this case, the semiconductor layer 112 may cover sidewall and bottom portions of the liner insulating layer 110b, in the pixel isolation trench T2. When the semiconductor layer 112 is formed by the deposition process, a discontinuous interface (e.g., seam or void) may be formed in the semiconductor layer 112, as shown in FIG. 5A.

Figure 16:
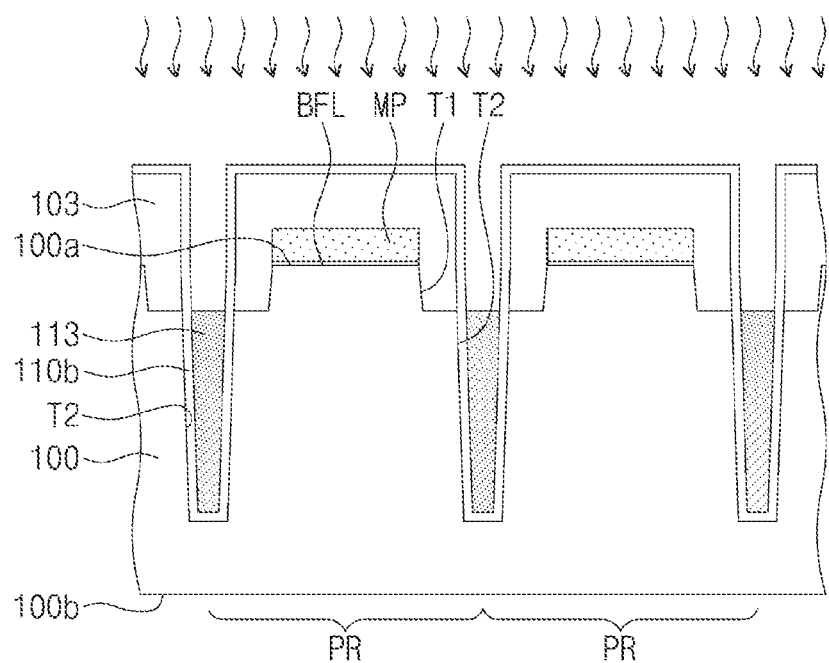

Referring to FIGS. 5, 10, and 16, the semiconductor pattern 113 may be formed by etching portions of the semiconductor layer 112, which are located on the top surface of the device isolation insulating layer 103 and in an upper region of the pixel isolation trench T2.

A top surface of the semiconductor pattern 113 may be located at a level higher than or equal to a bottom surface of the device isolation trench T1. That is, the semiconductor pattern 113 may be formed to fill a lower region of the pixel isolation trench T2. In an embodiment, the top surface of the semiconductor pattern 113 is located at a level lower than the bottom surface of the device isolation trench T1.

Next, a thermal treatment process is performed on the semiconductor substrate 100 (in S50).

In an embodiment, the thermal treatment process may be performed within a temperature range of about 550° C. to 800° C. During the thermal treatment process, Nitrogen $N_2$, Argon Ar, Hydrogen $H_2$, or Oxygen $O_2$ gas may be used as the process gas.

The dopants of the first conductivity type in the liner insulating layer 110b may be diffused into the semiconductor pattern 113 by the thermal treatment process. That is, the semiconductor pattern 113 may be doped with the dopants, which are diffused from the liner insulating layer 110b. As a result, a doped polysilicon pattern may be formed in the pixel isolation trench T2.

Since, as described above, the semiconductor pattern 113 is doped with the dopants, the semiconductor pattern 113 may have a reduced electric resistance. In addition, by applying a specific voltage to the semiconductor pattern 113 doped with the dopants, it may be possible to reduce a dark current, which is caused by defects at an interface between the semiconductor substrate 100 and the pixel isolation trench T2.

After the thermal treatment process, a doping concentration in the liner insulating layer 110b may be higher than a doping concentration in the semiconductor pattern 113. Alternatively, after the thermal treatment process, the doping concentration in the liner insulating layer 110b may be substantially equal to the doping concentration in the semiconductor pattern 113. As an example, after the thermal treatment process, a concentration of the first conductivity type dopants in the liner insulating layer 110b may range from about $1 \times 10^{15}$ $cm^3$ to about $1 \times 10^{17}$ $cm^3$, and a concentration of the first conductivity type dopants in the semiconductor pattern 113 may range from about $1 \times 10^{13}$ $cm^3$ to about $1 \times 10^{17}$ $cm^3$. After the thermal treatment process, a concentration of the dopants of the first conductivity type in the semiconductor pattern 113 may be about 8 to 9 times a concentration of the dopants of the first conductivity type in the semiconductor substrate 100.

Figure 17:
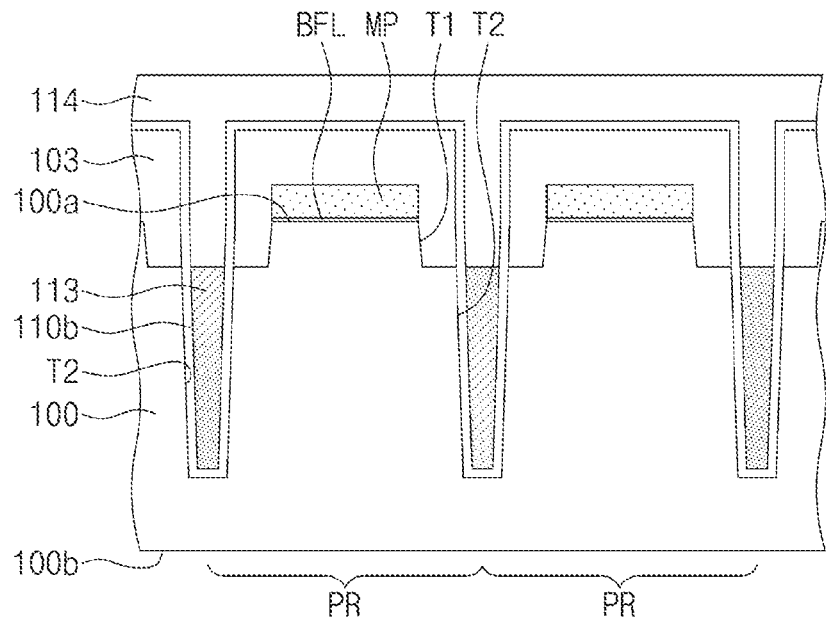

Referring to FIGS. 5, 10, and 17, an insulating gapfill layer 114 may be formed to fill the pixel isolation trench T2 provided with the semiconductor pattern 113.

The insulating gapfill layer 114 may be formed on the first surface 100a of the semiconductor substrate 100 to cover the liner insulating layer 110b. The insulating gapfill layer 114 may be formed of or include at least one of, for example, silicon oxide, silicon nitride, and/or silicon oxynitride.

The insulating gapfill layer 114 may be formed using a layer-forming method having a good step coverage property (e.g., a chemical vapor deposition (CVD) method or an atomic layer deposition (ALD) method). In this case, the insulating gapfill layer 114 may cover sidewall portions and the top surface of the liner insulating layer 110b, in the pixel isolation trench T2.

In an embodiment, the insulating gapfill layer 114 may be formed using a deposition method having a poor step coverage property. For example, the insulating gapfill layer 114 may be formed using a physical vapor deposition method.

Figure 18:
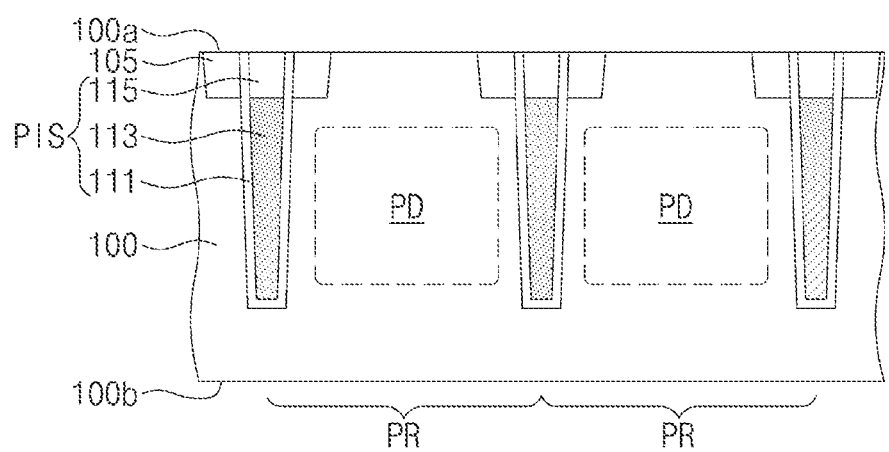

Next, referring to FIGS. 5, 10, and 18, the liner insulating layer 110b and the insulating gapfill layer 114 may be planarized to expose a top surface of the mask pattern MP. As a result, the liner insulating pattern 111, the semiconductor pattern 113, and the gapfill insulating pattern 115 may be formed in the pixel isolation trench T2. Accordingly, the pixel isolation structure PIS may be formed in the pixel isolation trench T2.

The mask pattern MP may be removed after the formation of the pixel isolation structure PIS, and the device isolation layer 105 may be formed in the device isolation trench T1 by planarizing the device isolation insulating layer 103 to expose the first surface 100a of the semiconductor substrate 100. Since the planarization process is performed to expose the first surface 100a of the semiconductor substrate 100, the pixel isolation structure PIS may have a top surface that is substantially coplanar with the top surface of the device isolation layer 105.

Referring to FIGS. 5 and 18, the photoelectric conversion regions PD of the second conductivity type may be formed in the semiconductor substrate 100.

The photoelectric conversion regions PD may be formed by injecting impurities, which are of the second conductivity type (e.g., n-type) different from the first conductivity type, into the semiconductor substrate 100. The photoelectric conversion regions PD may be spaced apart from the first and second surfaces 100a and 100b of the semiconductor substrate 100.

An example in which the photoelectric conversion regions PD are formed after the formation of the pixel isolation structure PIS is described, but in an embodiment, the photoelectric conversion regions PD may be formed before the formation of the pixel isolation structure PIS.

Figure 19:
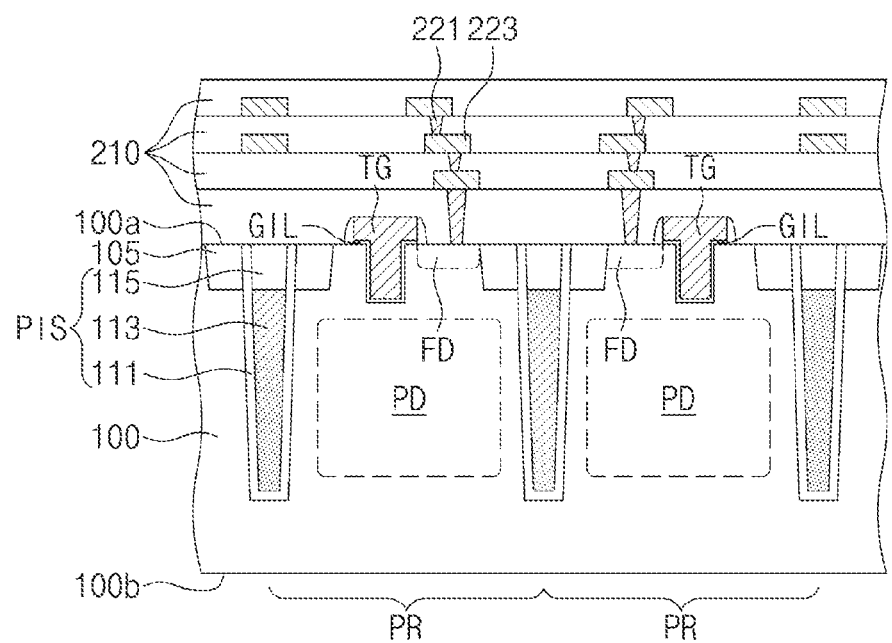

Next, referring to FIGS. 5, 10, and 19, MOS transistors constituting the readout circuits may be formed on the first surface 100a of the semiconductor substrate 100.

In detail, the transfer gate electrodes TG may be formed on the pixel regions PR, respectively. The formation of the transfer gate electrodes TG may include patterning the semiconductor substrate 100 to form a gate recess region in each of the pixel regions PR, forming a gate insulating layer to conformally cover an inner surface of the gate recess region, forming a gate conductive layer to fill the gate recess region, and patterning the gate conductive layer. For example, the gate recess region may be formed in surface 100a.

In addition, gate electrodes of readout transistors may also be formed in each of the pixel regions PR, when the transfer gate electrodes TG are formed by patterning the gate conductive layer.

The floating diffusion regions FD may be formed in portions of the semiconductor substrate 100, each of which is located at a side of the transfer gate electrode TG, after the formation of the transfer gate electrodes TG. The floating diffusion regions FD may be formed by an ion injection process of injecting impurities of the second conductivity type into the semiconductor substrate 100. Furthermore, impurity regions, which are used as source/drain electrodes of the readout transistors, may be formed, when the floating diffusion regions FD are formed.

The interlayer insulating layers 210 and the interconnection structure 221 and 223 may be formed on the first surface 100a of the semiconductor substrate 100.

The interlayer insulating layers 210 may be formed to cover transfer transistors and logic transistors. The interlayer insulating layers 210 may be formed of a material having a good gap-filling property and may be formed to have a substantially flat top surface.

The contact plugs 221, which are connected to the floating diffusion region FD or the readout transistors, may be formed in the interlayer insulating layers 210. The metal lines 223 may be formed between the interlayer insulating layers 210. The contact plugs 221 and the metal lines 223 may be formed of or include at least one of, for example, copper (Cu), aluminum (Al), tungsten (W), titanium (Ti), molybdenum (Mo), tantalum (Ta) titanium nitride (TiN), tantalum nitride (TaN), zirconium nitride (ZrN), tungsten nitride (WN), and alloys thereof.

Figure 20:
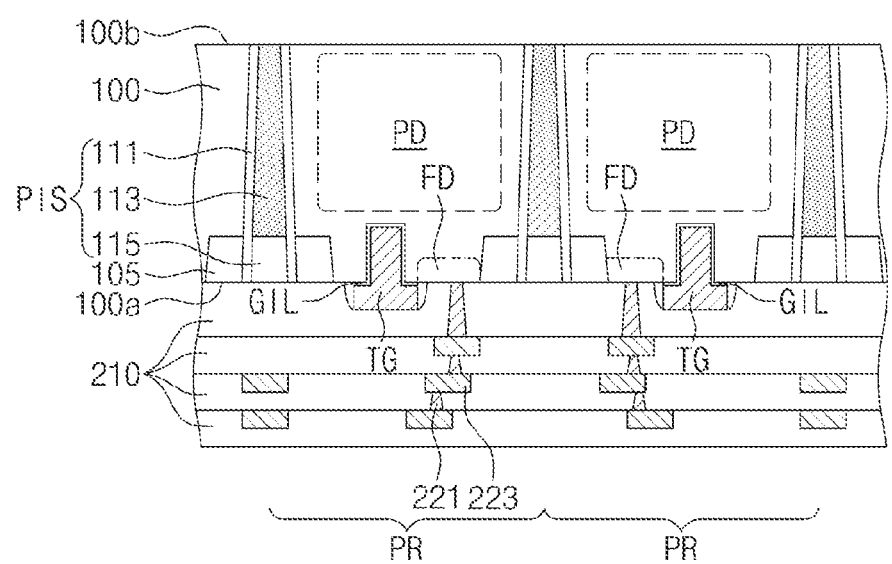

Referring to FIGS. 5, 10, and 20, a thinning process may be performed to remove a portion of the semiconductor substrate 100 or to reduce a vertical thickness of the semiconductor substrate 100. The thinning process may include grinding or polishing the second surface 100b of the semiconductor substrate 100 and anisotropically and isotropically etching the semiconductor substrate 100. The semiconductor substrate 100 may be inverted, for the thinning process.

As an example, a grinding or polishing process may be performed to remove the bulk silicon substrate of the semiconductor substrate 100 and to expose the epitaxial layer of the semiconductor substrate 100. Thereafter, an anisotropic or isotropic etching process may be performed to remove surface defects, which may exist on the exposed surface of the epitaxial layer. The exposed surface of the epitaxial layer may correspond to the second surface 100b of the semiconductor substrate 100.

The thinning process on the semiconductor substrate 100 may be performed to expose the semiconductor pattern 113 of the pixel isolation structure PIS near the second surface 100b of the semiconductor substrate 100. As a result, the semiconductor pattern 113 and the liner insulating pattern 111 may have surfaces that are located at substantially the same level as the second surface 100b of the semiconductor substrate 100.

Next, the planarization insulating layer 310 may be formed on the second surface 100b of the semiconductor substrate 100. The planarization insulating layer 310 may cover the surface of the semiconductor pattern 113 and the second surface 100b of the semiconductor substrate 100. The planarization insulating layer 310 may be formed by depositing a metal oxide layer (e.g., aluminum oxide and/or hafnium oxide).

Figure 21:
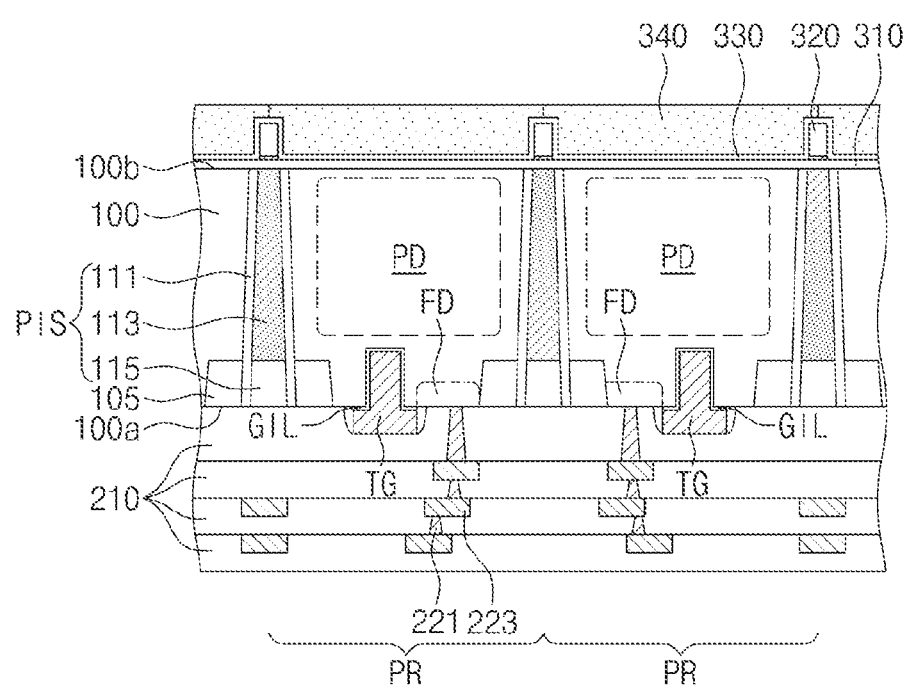

Referring to FIGS. 5, 10, and 21, the lattice structure 320 may be formed on the planarization insulating layer 310. The lattice structure 320 may include a light-blocking pattern and/or a low refractive pattern. The light-blocking pattern may be formed of or include at least one of metallic materials (e.g., titanium, tantalum, or tungsten). The low refractive pattern may be formed of or include a material whose refractive index is lower than the light-blocking pattern. The low refractive pattern may be formed of an organic material and may have a refractive index of about 1.1 to 1.3. For example, the lattice structure 320 may be a polymer layer, in which silica nano-particles are included.

The lattice structure 320 may extend in the first and second directions D1 and D2 to have a lattice shape. The lattice structure 320 may overlap with the semiconductor pattern 113, when viewed in a plan view.

The protection layer 330 may be formed on the planarization insulating layer 310 to cover a surface of the lattice structure 320 conformally (i.e., to a substantially uniform thickness). The protection layer 330 may be a single- or multi-layered structure including at least one of an aluminum oxide layer and a silicon carbon oxide layer.

Thereafter, the color filters 340 may be disposed on the protection layer 330 to correspond to the first and second pixel regions, respectively. The color filters 340 may include blue, red, and green color filters.

Next, the micro lenses 350 may be formed on the color filters 340, respectively. The micro lenses 350 may have a convex shape and may have a specific curvature radius. The micro lenses 350 may be formed of or include an optically transparent resin.

The passivation layer 360 may conformally cover top surfaces of the micro lenses 350. The passivation layer 360 may be formed of or include, for example, an inorganic oxide material.

Figure 22:
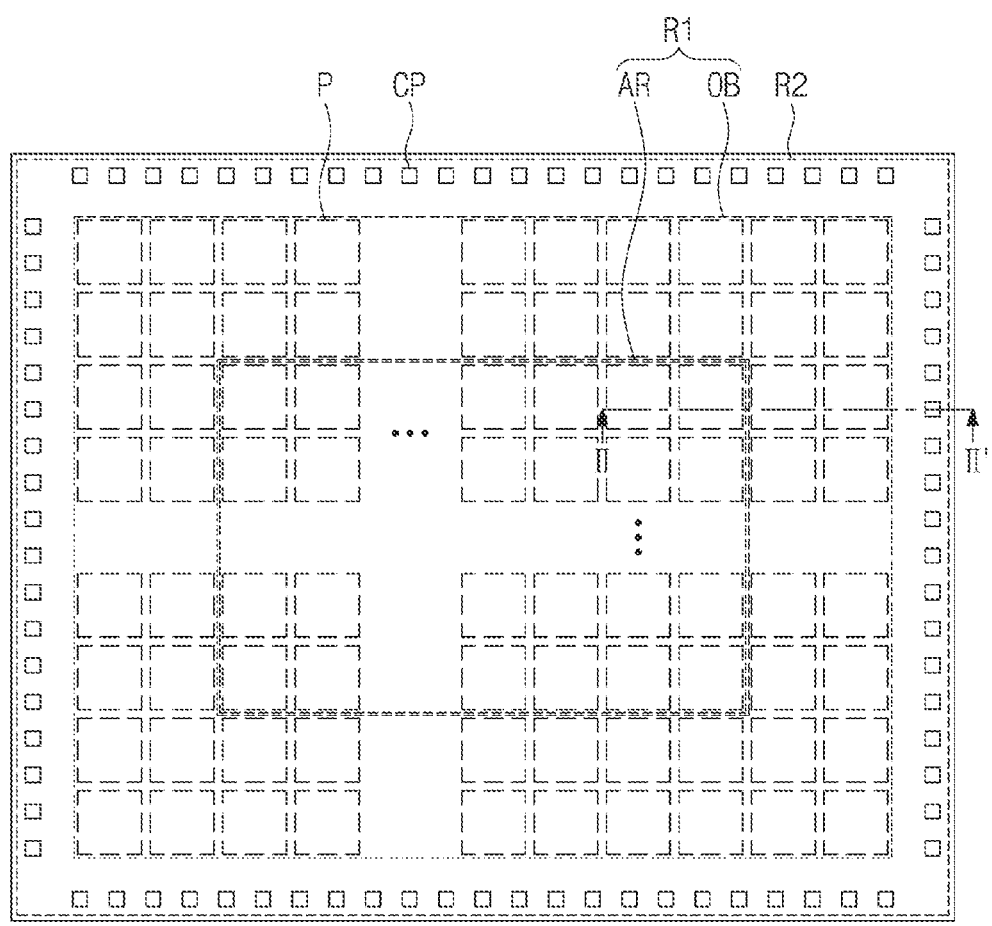
FIG. 22 is a schematic plan view of an image sensor including a semiconductor device according to an embodiment of the inventive concept.
Figure 23:
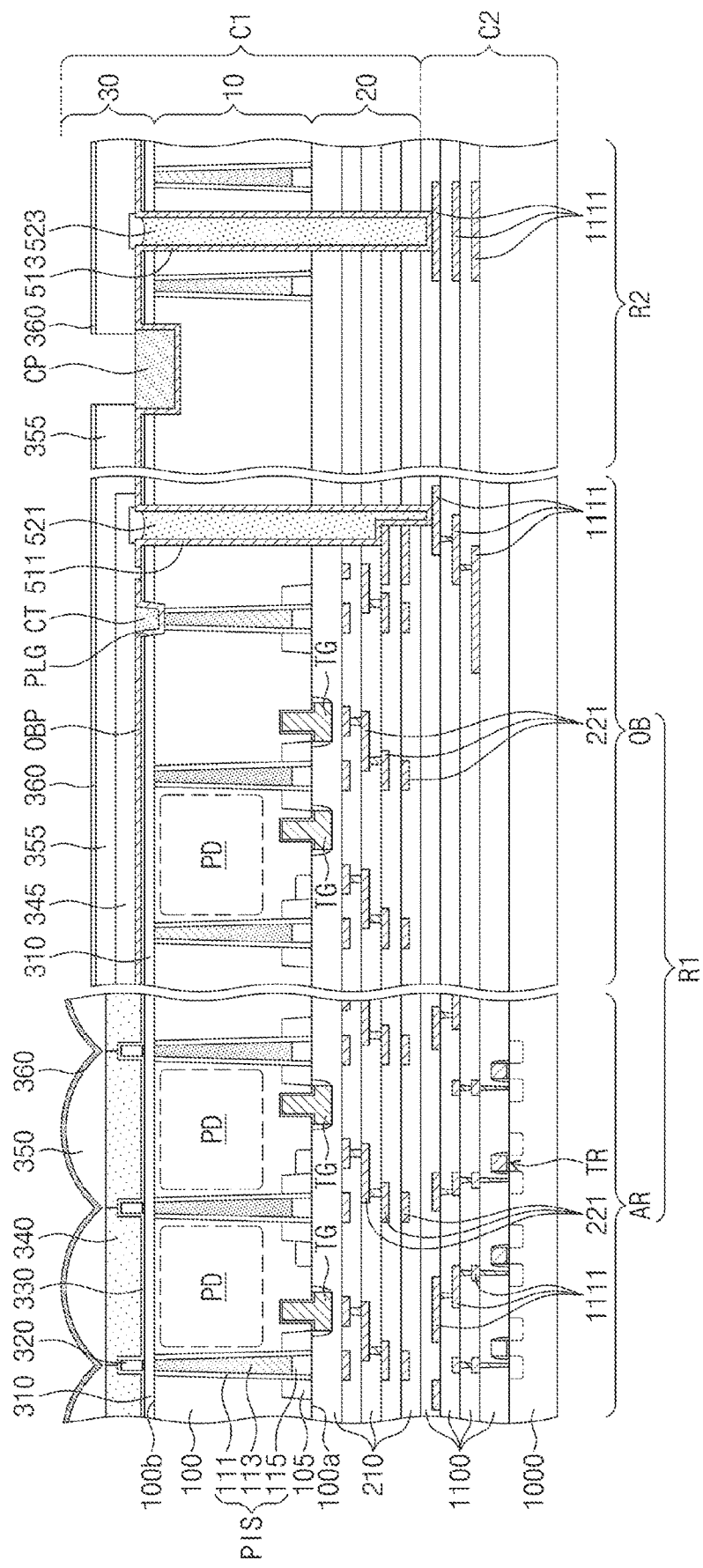
FIGS. 23 and 24 are sectional views, each of which is taken along a line II-IT of FIG. 22 to illustrate an image sensor according to an embodiment of the inventive concept.
Figure 24:
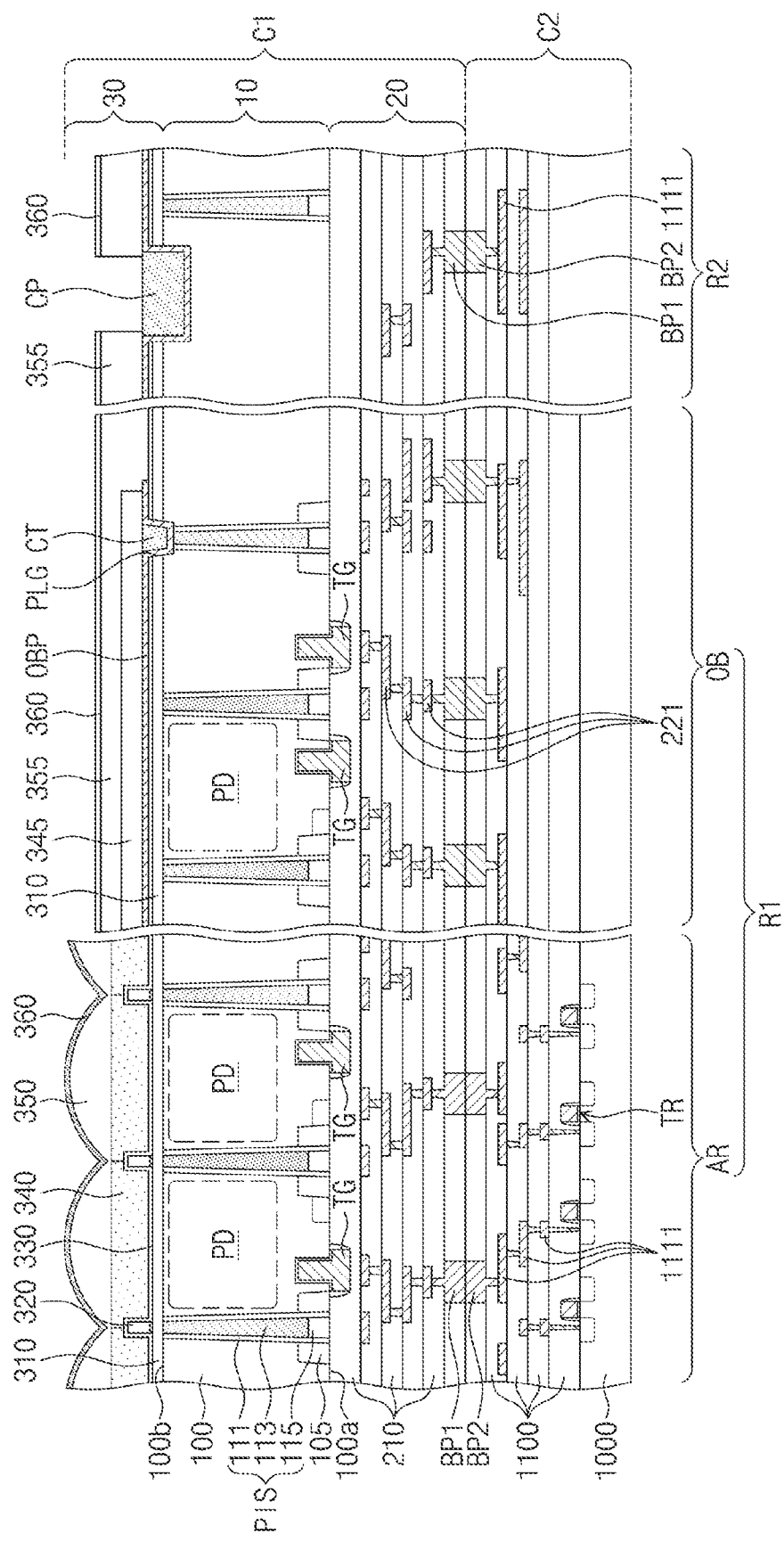

FIG. 22 is a schematic plan view of an image sensor including a semiconductor device according to an embodiment of the inventive concept. FIGS. 23 and 24 are sectional views, each of which is taken along a line II-IT of FIG. 22 to illustrate an image sensor according to an embodiment of the inventive concept.

Referring to FIGS. 22 and 23, the image sensor may include a sensor chip C1 and a logic chip C2. The sensor chip C1 may include a pixel array region R1 and a pad region R2.

The pixel array region R1 may include a plurality of unit pixels P, which are two-dimensionally arranged in two different directions (e.g., in the first and second directions D1 and D2). Each of the unit pixels P may include a photoelectric conversion device and readout devices. An electrical signal, which is produced by an incident light, may be output from each of the unit pixels P of the pixel array region R1.

The pixel array region R1 may include a light-receiving region AR and a light-blocking region OB. The light-blocking region OB may be provided to enclose the light-receiving region AR, when viewed in a plan view. For example, the light-blocking region OB may be provided to enclose the light-receiving region AR in four different directions (e.g., up, down, left, and rights directions), when viewed in a plan view. In an embodiment, reference pixels, to which light is not incident, may be provided in the light-blocking region OB. In this case, by comparing a charge amount, which is obtained from the unit pixel P in the light-receiving region AR, with a reference amount of charges produced in the reference pixels, it may be possible to calculate a magnitude of an electrical signal sensed from the unit pixel P.

A plurality of conductive pads CP, which are used to input or output control signals and photoelectric signals, may be disposed in the pad region R2. The pad region R2 may be provided to enclose the pixel array region R1, when viewed in a plan view. In this case, it may be possible to facilitate an electric connection between the image sensor and an external device. The conductive pads CP may be used to transmit electrical signals, which are produced in the unit pixels P, to an external device.

In the light-receiving region AR, the sensor chip C1 may be configured to have the same technical features as the image sensor described above. That is, when viewed in the vertical direction, the sensor chip C1 may include the readout circuit layer 20, the optically-transparent layer 30, and the photoelectric conversion layer 10 therebetween, as described above. The photoelectric conversion layer 10 of the sensor chip C1 may include the semiconductor substrate 100, the pixel isolation structure PIS defining pixel regions, and the photoelectric conversion regions PD provided in the pixel regions, as described above. The pixel isolation structure PIS may have substantially the same structure on the light-receiving region AR and the light-blocking region OB.

The optically-transparent layer 30 may include a light-blocking pattern OBP, a back-side contact plug PLG, and a contact pattern CT, an organic layer 355, and the passivation layer 360, which are provided on the light-blocking region OB.

A portion of the pixel isolation structure PIS may be connected to the back-side contact plug PLG, on the light-blocking region OB.

In detail, the semiconductor pattern 113 may be connected to the back-side contact plug PLG, on the light-blocking region OB. A negative bias may be applied to the semiconductor pattern 113 through the contact pattern CT and the back-side contact plug PLG. Accordingly, it may be possible to reduce a dark current which may be generated at an interface between the pixel isolation structure PIS and the semiconductor substrate 100.

In an embodiment, the back-side contact plug PLG has a width that is larger than a width of the pixel isolation structure PIS. The back-side contact plug PLG may be formed of or include at least one of metallic materials and/or metal nitrides. For example, the back-side contact plug PLG may be formed of or include at least one of titanium and/or titanium nitride.

The contact pattern CT may be buried in a contact hole provided with the back-side contact plug PLG. The contact pattern CT may include a material that is different from the back-side contact plug PLG. For example, the contact pattern CT may be formed of or include aluminum (Al).

The contact pattern CT may be electrically connected to the semiconductor pattern 113 of the pixel isolation structure PIS. A negative bias may be applied to the semiconductor pattern 113 of the pixel isolation structure PIS through the contact pattern CT, and the negative bias may be transmitted from the light-blocking region OB to the light-receiving region AR.

In the light-blocking region OB, the light-blocking pattern OBP may continuously extend from the back-side contact plug PLG and may be disposed on a top surface of the planarization insulating layer 310. That is, the light-blocking pattern OBP may be formed of or include the same material as the back-side contact plug PLG. The light-blocking pattern OBP may be formed of or include at least one of metallic materials and/or metal nitride materials. For example, the light-blocking pattern OBP may be formed of or include at least one of titanium and/or titanium nitride. In an embodiment, the light-blocking pattern OBP does not extend to the light-receiving region AR of the pixel array region R1.

The light-blocking pattern OBP may prevent light from being incident into the photoelectric conversion regions PD, which are provided on the light-blocking region OB. The photoelectric conversion regions PD in the reference pixels of the light-blocking region OB may be configured to output a noise signal, not a photoelectric signal. The noise signal may be produced by electrons, which are generated by heat or a dark current.

The protection layer 330 may extend from the pixel array region R1 to the pad region R2. The protection layer 330 may cover a top surface of the light-blocking pattern OBP.

A filter layer 345 may be provided on the light-blocking region OB to cover the protection layer 330. The filter layer 345 may be configured to block light whose wavelength is different from that by the color filters 340. For example, the filter layer 345 may block infrared light. In an embodiment, the filter layer 345 may include a blue color filter, but the inventive concept is not limited to this example.

The organic layer 355 and the passivation layer 360 may be disposed on the protection layer 330 in the light-blocking region OB and the pad region R2. The organic layer 355 may be formed of or include the same material as the micro lenses 350.

A first penetration conductive pattern 511 may be provided in the light-blocking region OB to penetrate the semiconductor substrate 100 and may be electrically connected to the metal line 223 of the readout circuit layer 20 and an interconnection structure 1111 of the logic chip C2. The first penetration conductive pattern 511 may have a first bottom surface and a second bottom surface, which are located at different levels. A first gapfill pattern 521 may be provided in the first penetration conductive pattern 511. The first gapfill pattern 521 may be formed of or include at least one of low refractive materials and may have an insulating property.

The conductive pads CP may be disposed in portions of the semiconductor substrate 100 which are located in the pad region R2 and adjacent to the second surface 100b. The conductive pads CP may be buried in portions of the semiconductor substrate 100 located near the second surface 100b. In an embodiment, the conductive pads CP may be provided in pad trenches, which are formed in the second surface 100b of the semiconductor substrate 100 and are located in the pad region R2. The conductive pads CP may be formed of or include at least one of metallic materials (e.g., aluminum, copper, tungsten, titanium, tantalum, or alloys thereof). In a mounting process of an image sensor, bonding wires may be bonded to the conductive pads CP.

The conductive pads CP may be electrically connected to an external device through bonding wires.

A second penetration conductive pattern 513 may be provided on the pad region R2 to penetrate the semiconductor substrate 100 and may be electrically connected to the interconnection structure 1111 of the logic chip C2. The second penetration conductive pattern 513 may extend to a region on the second surface 100b of the semiconductor substrate 100 and may be electrically connected to the conductive pads CP. A portion of the second penetration conductive pattern 513 may cover bottom and side surfaces of the conductive pads CP. A second gapfill pattern 523 may be provided in the second penetration conductive pattern 513. The second gapfill pattern 523 may be formed of or include at least one of low refractive materials and may have an insulating property. The first and second pixel isolation structures PIS1 and PIS2 may be provided on the pad region R2 to enclose the second penetration conductive pattern 513.

The logic chip C2 may include a logic semiconductor substrate 1000, logic circuits (TR), the interconnection structures 1111 connected to the logic circuits, and logic interlayer insulating layers 1100. The uppermost layer of the logic interlayer insulating layers 1100 may be coupled to the readout circuit layer 20 of the sensor chip C1. The logic chip C2 may be electrically connected to the sensor chip C1 through the first and second penetration conductive patterns 511 and 513.

In an embodiment, the sensor and logic chips C1 and C2 are illustrated to be electrically connected to each other through the first and second penetration conductive patterns 511 and 513, but the inventive concept is not limited to this example.

In the embodiment shown in FIG. 24, the first and second penetration conductive patterns of FIG. 23 may be omitted, and the sensor and logic chips C1 and C2 may be electrically connected to each other by directly connecting bonding pads, which are respectively provided in the uppermost metal layers of the sensor and logic chips C1 and C2, to each other.

In detail, the sensor chip C1 of the image sensor may include first bonding pads BP1, which are provided in the uppermost metal layer of the readout circuit layer 20, and the logic chip C2 may include second bonding pads BP2, which are provided in the uppermost metal layer of the interconnection structure 1111. The first and second bonding pads BP1 and BP2 may be formed of or include at least one of, for example, tungsten (W), aluminum (Al), copper (Cu), tungsten nitride (WN), tantalum nitride (TaN), or titanium nitride (TiN).

The first bonding pads BP1 of the sensor chip C1 and the second bonding pads BP2 of the logic chip C2 may be directly and electrically connected to each other in a hybrid bonding manner. Here, the hybrid bonding manner may mean a bonding manner of fusing two elements containing the same kind of material into a single element at an interface therebetween. For example, in the case where the first and second bonding pads BP1 and BP2 are formed of copper (Cu), they may be physically and electrically connected to each other in a Cu—Cu bonding manner. In addition, insulating layers of the sensor and logic chips C1 and C2 may be bonded to each other in a dielectric-dielectric bonding manner.

According to an embodiment of the inventive concept, a liner insulating layer in a pixel isolation trench may be pre-doped with dopants, the pixel isolation trench may be filled with a semiconductor material formed by a single deposition process, and then, a thermal process may be performed to form a semiconductor pattern doped with the dopants. Accordingly, it may be possible to form the doped semiconductor pattern in the pixel isolation trench, even when the pixel isolation trench has a high aspect ratio.

Thus, it may be possible to reduce complexity and cost in a process of fabricating an image sensor, to improve a dark current property of the image sensor, and to reduce an electric resistance of the semiconductor pattern.

While example embodiments of the inventive concept have been particularly shown and described, it will be understood by one of ordinary skill in the art that variations in form and detail may be made therein without departing from the spirit and scope of the attached claims.

What is claimed is:

1. A method of fabricating an image sensor, comprising:
forming a semiconductor substrate of a first conductivity type;
forming an isolation trench defining pixel regions in the semiconductor substrate;
forming a liner insulating layer in the isolation trench;
doping the liner insulating layer with dopants of the first conductivity type;
forming a semiconductor layer on the liner insulating layer to fill the isolation trench, after the doping of the dopants in the liner insulating layer; and
performing a thermal treatment process on the semiconductor substrate, after forming the semiconductor layer on the liner insulating layer,
wherein, after the thermal treatment process, the semiconductor layer is doped with the same dopants as the dopants doped in the liner insulating layer.

2. The method of claim 1, wherein, after the thermal treatment process, a concentration of the dopants in the liner insulating layer is higher than a concentration of the dopants in the semiconductor layer.

3. The method of claim 1, further comprising, etching the semiconductor layer such that a top surface of the semiconductor layer is located at a level lower than a top surface of the semiconductor substrate, before the thermal treatment process.

4. The method of claim 1, wherein the doping of the dopants comprises performing a plasma doping process, a beam line ion implantation process, or a gas phase doping process.

5. The method of claim 1, wherein, after the thermal treatment process, a concentration of the dopants of the first conductivity type in the semiconductor layer is about 8 to 9 times a concentration of the dopants of the first conductivity type in the semiconductor substrate.

6. The method of claim 1, wherein the isolation trench has an aspect ratio of about 10:1 to 15:1.

7. The method of claim 1, wherein the semiconductor layer is composed of a single poly-silicon layer.

8. A method of fabricating an image sensor, comprising:
preparing a semiconductor substrate of a first conductivity type, the semiconductor substrate having a first surface and a second surface opposite to the first surface;
forming a device isolation layer near the first surface of the semiconductor substrate;
forming an isolation structure to penetrate the device isolation layer and the semiconductor substrate and to define a plurality of pixel regions;
forming photoelectric conversion regions of a second conductivity type, in the semiconductor substrate and in the pixel regions, respectively; and forming a pixel gate electrode and a transfer gate electrode on the first surface of the semiconductor substrate, in each of the pixel regions, wherein the forming of the isolation structure comprises:
patterning the device isolation layer and the semiconductor substrate to form an isolation trench;
depositing a liner insulating layer on a surface of the isolation trench;
doping the liner insulating layer with dopants of the first conductivity type;
forming an undoped poly-silicon layer to fill the isolation trench, after the forming of the liner insulating layer doped with the dopants;
etching the undoped poly-silicon layer to form a polysilicon pattern having a top surface located at a level lower than the first surface of the semiconductor substrate; and
performing a thermal treatment process on the semiconductor substrate, after forming the polysilicon pattern on the liner insulating layer doped with the dopants,
wherein, after the thermal treatment process, the polysilicon pattern is doped with the same dopants as the dopants doped in the liner insulating layer.

9. The method of claim 8, wherein a concentration of the dopants in the liner insulating layer is higher than a concentration of the dopants in the polysilicon pattern, after the thermal treatment process.

10. The method of claim 8, wherein a concentration of the dopants of the first conductivity type in the polysilicon pattern is about 8 to 9 times that in the semiconductor substrate, after the thermal treatment process.

11. The method of claim 8, wherein the forming of the isolation structure further comprises forming a gapfill insulating pattern on the polysilicon pattern, after the thermal treatment process, and
a top surface of the gapfill insulating pattern is coplanar with a top surface of the device isolation layer.

12. The method of claim 8, further comprising forming a planarization insulating layer on the second surface of the semiconductor substrate,
wherein the planarization insulating layer is in contact with a bottom surface of the liner insulating layer and a bottom surface of the polysilicon pattern.

13. The method of claim 12, further comprising:
forming color filters on the planarization insulating layer to correspond to the pixel regions; and
forming micro lenses on the color filters.

14. The method of claim 8, further comprising forming a back-side contact plug coupled to a portion of the polysilicon pattern.

15. The method of claim 8, wherein the isolation trench comprises a plurality of first regions extending in a first direction, and a plurality of second regions extending in a second direction crossing the first direction and crossing the first regions, and
the polysilicon pattern continuously extends in both the first and the second directions.

16. An image sensor, comprising:
a semiconductor substrate of a first conductivity type;
an isolation structure located in the semiconductor substrate to define a plurality of pixel regions, the isolation structure comprising a semiconductor pattern vertically penetrating the semiconductor substrate and a liner insulating pattern interposed between the semiconductor pattern and the semiconductor substrate; and
a back-side contact plug coupled to a portion of the semiconductor pattern,
wherein the semiconductor pattern and the liner insulating pattern comprise dopants of the first conductivity type, and
wherein a concentration of the dopants of the first conductivity type is higher in the liner insulating pattern than in the semiconductor pattern.

17. The image sensor of claim 16, wherein the semiconductor pattern is composed of a single poly-silicon layer.

18. The image sensor of claim 16, wherein the concentration of the dopants of the first conductivity type in the semiconductor pattern is about 8 to 9 times that in the semiconductor substrate.

19. The image sensor of claim 16, wherein the semiconductor substrate has a first surface and a second surface opposite the first surface, and
the concentration of the dopants in the semiconductor pattern decreases in a direction from the first surface of the semiconductor substrate toward the second surface.

20. The image sensor of claim 16, wherein the isolation structure further comprises a gapfill insulating pattern disposed on the semiconductor pattern and having a top surface located at the same level as the first surface of the semiconductor substrate.

* * * * *